United States Patent
Fujimoto et al.

(10) Patent No.: US 9,082,070 B2
(45) Date of Patent: Jul. 14, 2015

(54) SCREEN PRINTING APPARATUS

(71) Applicant: YAMAHA HATSUDOKI KABUSHIKI KAISHA, Shizuoka-ken (JP)

(72) Inventors: Takeshi Fujimoto, Shizuoka (JP); Yasuhito Enatsu, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 0 days.

(21) Appl. No.: 14/379,372

(22) PCT Filed: Dec. 25, 2012

(86) PCT No.: PCT/JP2012/008281
§ 371 (c)(1),
(2) Date: Aug. 18, 2014

(87) PCT Pub. No.: WO2013/124942
PCT Pub. Date: Aug. 29, 2013

(65) Prior Publication Data
US 2015/0009524 A1    Jan. 8, 2015

(30) Foreign Application Priority Data
Feb. 21, 2012  (JP) ................................. 2012-035227

(51) Int. Cl.
G06F 15/00    (2006.01)
G06F 3/12    (2006.01)
G06K 1/00    (2006.01)
B41F 15/08    (2006.01)
B41F 15/12    (2006.01)
B41F 35/00    (2006.01)
G06K 15/00    (2006.01)
H05K 3/34    (2006.01)

(52) U.S. Cl.
CPC ................. *G06K 15/40* (2013.01); *B41F 15/08* (2013.01); *B41F 15/12* (2013.01); *B41F 35/005* (2013.01); *B41P 2235/242* (2013.01); *B41P 2235/244* (2013.01); *B41P 2235/26* (2013.01); *H05K 3/3484* (2013.01)

(58) Field of Classification Search
CPC ......... G06K 15/40; B41F 15/08; B41F 15/12; B41F 35/005
USPC ......................................... 358/1.1, 1.14, 1.15
See application file for complete search history.

(56) References Cited

U.S. PATENT DOCUMENTS

2009/0174747 A1*  7/2009  Sato ................................ 347/19
2010/0307358 A1* 12/2010  Sakaue et al. ................. 101/425

FOREIGN PATENT DOCUMENTS

JP  01-212492 A  8/1989
JP  10-202827 A  8/1998
(Continued)

OTHER PUBLICATIONS

International Search Report; PCT/JP2012/008281; Feb. 19, 2013.

*Primary Examiner* — Douglas Tran
(74) *Attorney, Agent, or Firm* — Studebaker & Brackett PC

(57) ABSTRACT

A screen printing apparatus is provided with a control unit for obtaining a residual quantity of a consumable consumed by a cleaning unit prior to starting printing on a plurality of print substrates. The control unit predicts a print executable number based on an obtained residual quantity a display/operation unit provides a prediction-result of a processable quantity. The screen printing apparatus enables preferred consumption prediction of consumable supplies such as a cleaning sheet of a cleaning unit and a cleaning agent at a required timing, thereby contributing to improvement of an operating ratio.

16 Claims, 12 Drawing Sheets

(56) References Cited

FOREIGN PATENT DOCUMENTS

| | | | |
|---|---|---|---|
| JP | 2002-127454 A | 5/2002 |
| JP | 2003-072033 A | 3/2003 |
| JP | 2003-170570 A | 6/2003 |
| JP | 2007-136960 A | 6/2007 |
| JP | 2008-074054 A | 4/2008 |

* cited by examiner

SCREEN PRINTING APPARATUS

CROSS REFERENCE TO RELATED APPLICATIONS

This application claims benefit of priority to Japanese Patent Application 2012-035227 filed on Feb. 21, 2012, and to International Patent Application No. PCT/JP2012/008281 filed on Dec. 25, 2012, the entire content of each of which is incorporated herein by reference.

TECHNICAL FIELD

The present technical field relates to a screen printing apparatus and, more particularly, to a screen printing apparatus that applies an applying material such as cream solder to a print substrate via a mask sheet on which a printing pattern is formed. The screen printing apparatus including a cleaning unit configured to wipe off the applying material adhering to the mask sheet using a cleaning sheet.

BACKGROUND

For example, as described in Japanese Patent Application Laid-open No. 2003-170570, a cleaning unit provided in a screen printing apparatus according to the disclosure includes a cleaning head including a vacuum nozzle, a supply section configured to supply a cleaning sheet to an upper part of the cleaning head, and a winding roll for the cleaning sheet. The screen printing apparatus is configured to wipe off an applying material adhering to an opening section outer circumference or the like of the rear surface of a mask sheet (a screen) by advancing and retracting the cleaning unit in a state in which the cleaning sheet is brought into contact with the rear surface of the mask sheet and an attractive force is exerted by the cleaning head.

The screen printing apparatus includes a cleaning agent supplying device including a spraying nozzle or the like for a cleaning agent. The screen printing apparatus is configured to spray, during cleaning of the mask sheet, the cleaning agent supplied from a storing section for the cleaning agent on a section to be cleaned to thereby improve cleaning efficiency of the mask sheet by the cleaning sheet.

Spray work for the cleaning agent does not need to be performed every time a cleaning operation for wiping off the applying material is performed. The spray work for the cleaning agent may also be performed intermittently according to a need of a user. In this description, a cleaning operation performed using the cleaning agent is referred to as "wet type cleaning" and a cleaning operation performed without using the cleaning agent is referred to as "dry type cleaning".

Incidentally, it is preferable to collect substantial residual quantities of consumable supplies such as the cleaning sheet. For such a purpose, a technique is widely used for various industrial products for detecting residual quantities of consumable supplies and, where the residual quantities are getting low, informing a user to that effect. For example, Japanese Patent Application Laid-open No. 2002-127454 discloses, residual quantity detection for an ink tank of an inkjet printer, a "sensor method" for detecting, with a sensor, a residual quantity of ink consumed as a consumable item, a "count method" for counting the number of times of use of the ink in one printing and multiplying a consumption of the consumable item per one printing estimated in advance with the number of times of use to thereby indirectly estimate a consumption of the ink, or a combined method of the "sensor method" and the "count method".

SUMMARY

In a production line for a print substrate in which the screen printing apparatus is adopted, it is important to improve operating ratios of individual apparatuses and facilities in order to improve an operating ratio of the production line. In the screen printing apparatus, there is a demand for a technique for improving an operating ratio as much as possible. In the screen printing apparatus, cleaning is executed during an operation and the cleaning sheet, the cleaning agent, and the like are consumed. Therefore, the screen printing apparatus has to be stopped often for replacement or the like during the operation, and the operating ratio is not so high.

On the other hand, in the related art, a consumption residual quantity of a consumable item is only measured or estimated. With respect to a consumption quantity needed for production, the obtained residual quantity cannot be appropriately evaluated. Therefore, even if a consumption residual quantity can be obtained during an operation using the technique disclosed in Japanese Patent Application Laid-open No. 2002-127454, at the timing when the consumption residual quantity is obtained, the screen printing apparatus under operation needs to be stopped for replacement or the like of the cleaning sheet and the cleaning agent. Consequently, the operating ratio cannot be improved.

The present disclosure has been devised in view of these problems and it is an object of the present disclosure to provide a screen printing apparatus that can prevent, by enabling preferred consumption prediction of a consumable item at a required timing, a screen printing apparatus, which had to be stopped in the past, from being stopped, thereby contributing to improvement of an operating ratio.

In order to solve the problems, the present disclosure provides a screen printing apparatus sequentially carrying out printing on a plurality of print substrates, the screen printing apparatus including: a mask sheet on which a printing pattern is formed; a squeegee configured to come into slide contact with the front surface of the mask sheet to print, on the print substrate mounted on the rear surface of the mask sheet, an applying material supplied to the front surface of the mask sheet; a cleaning unit configured to clean the rear surface of the mask sheet by feeding out a cleaning sheet at every predetermined execution interval of cleaning; a cleaning agent supply unit configured to supply a cleaning agent to the cleaning sheet at every predetermined execution interval of the cleaning; a residual quantity obtaining section configured to obtain a residual quantity of a consumable item consumed during cleaning or printing; a processable quantity predicting section configured to predict a print executable number based on the residual quantity obtained by the residual quantity obtaining section, the printable number being a scheduled number for producing the substrate; and a prediction-result informing section configured to inform a prediction-result by the processable quantity predicting section. In this mode, prior to a time when a lot production for sequentially printing a plurality of print substrates, or prior to a time when a suspended lot production is resumed, residual quantities of consumable supplies consumed by the cleaning unit and the cleaning agent supply unit are obtained in advance. The print executable number is predicted based on the residual quantities and a prediction-result is displayed. Therefore, a user can determine, according to the predicted print executable number, whether the user should start the screen printing apparatus to operate as it is or whether the user should supply necessary consumable supplies beforehand.

Further characteristics, purposes, configurations, and action and effects of the present disclosure will be easily understood from the following detailed explanation that should be read together with the accompanying drawings.

DETAILED DESCRIPTION

A best mode for carrying out the present disclosure is explained below with reference to the accompanying drawings.

Figure 1:
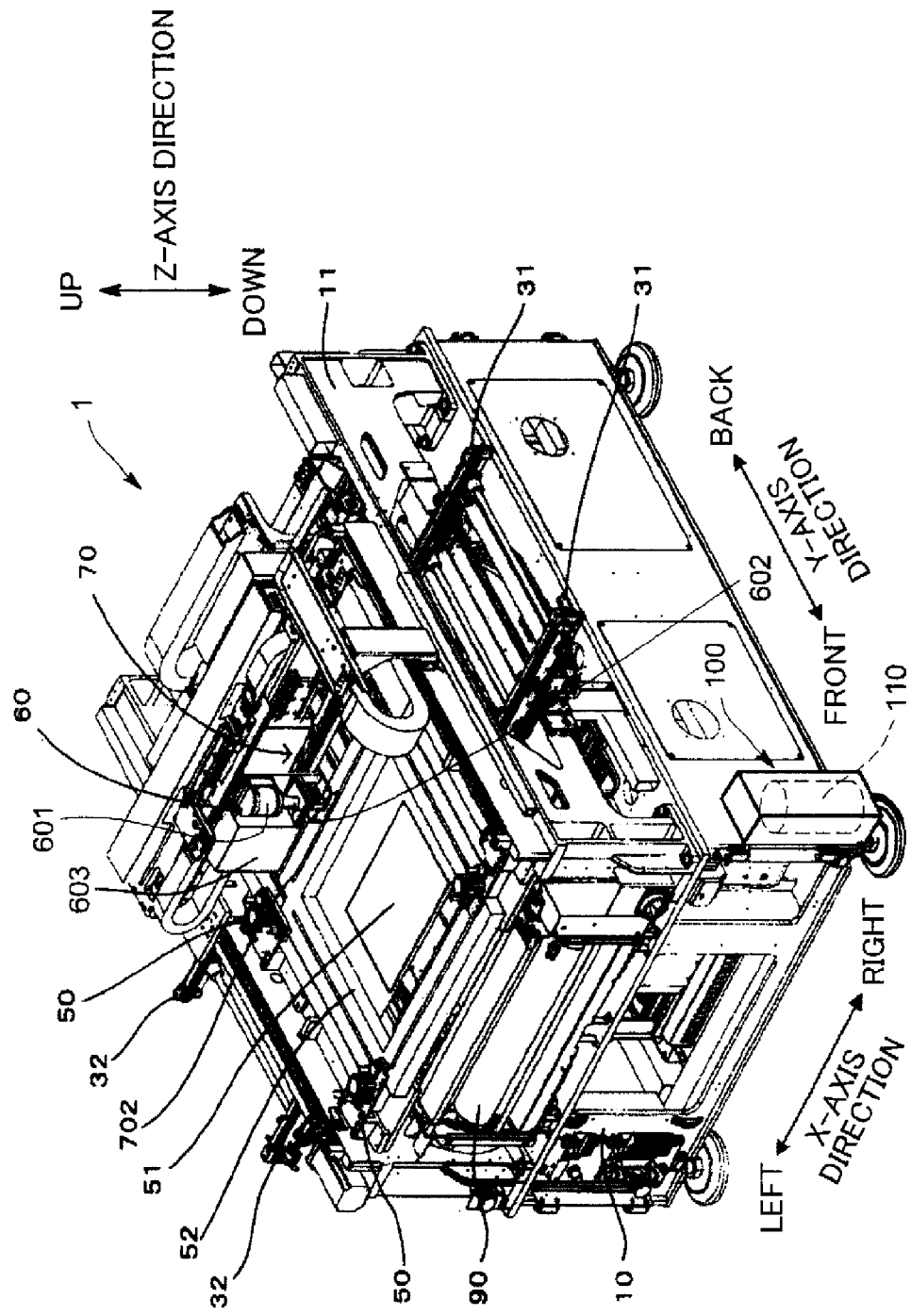
FIG. 1 is a perspective view showing a screen printing apparatus according to an embodiment of the present disclosure.
Figure 2:
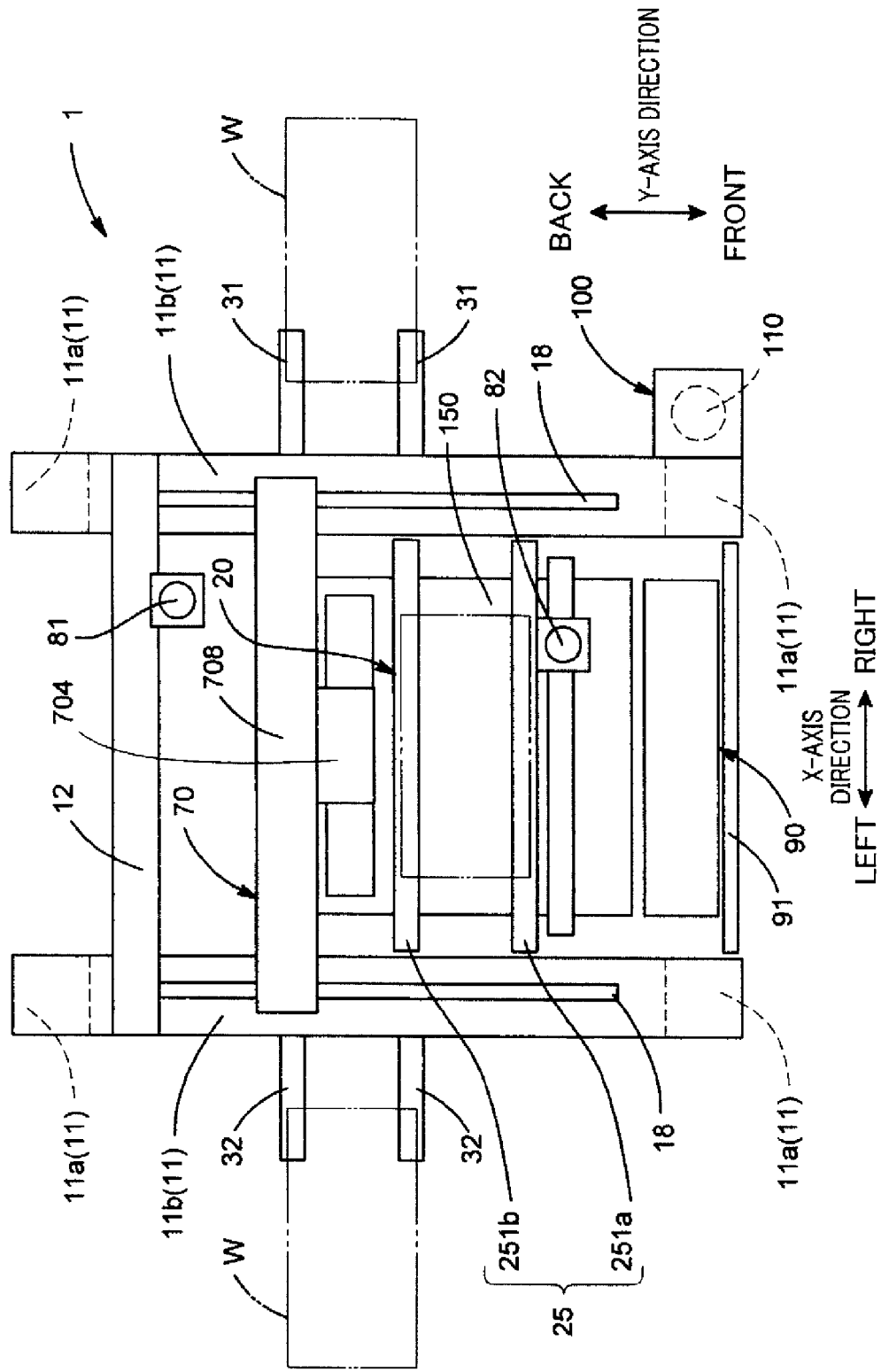
FIG. 2 is a plan view showing the schematic configuration of the screen printing apparatus in a state in which a mask is not set.
Figure 3:
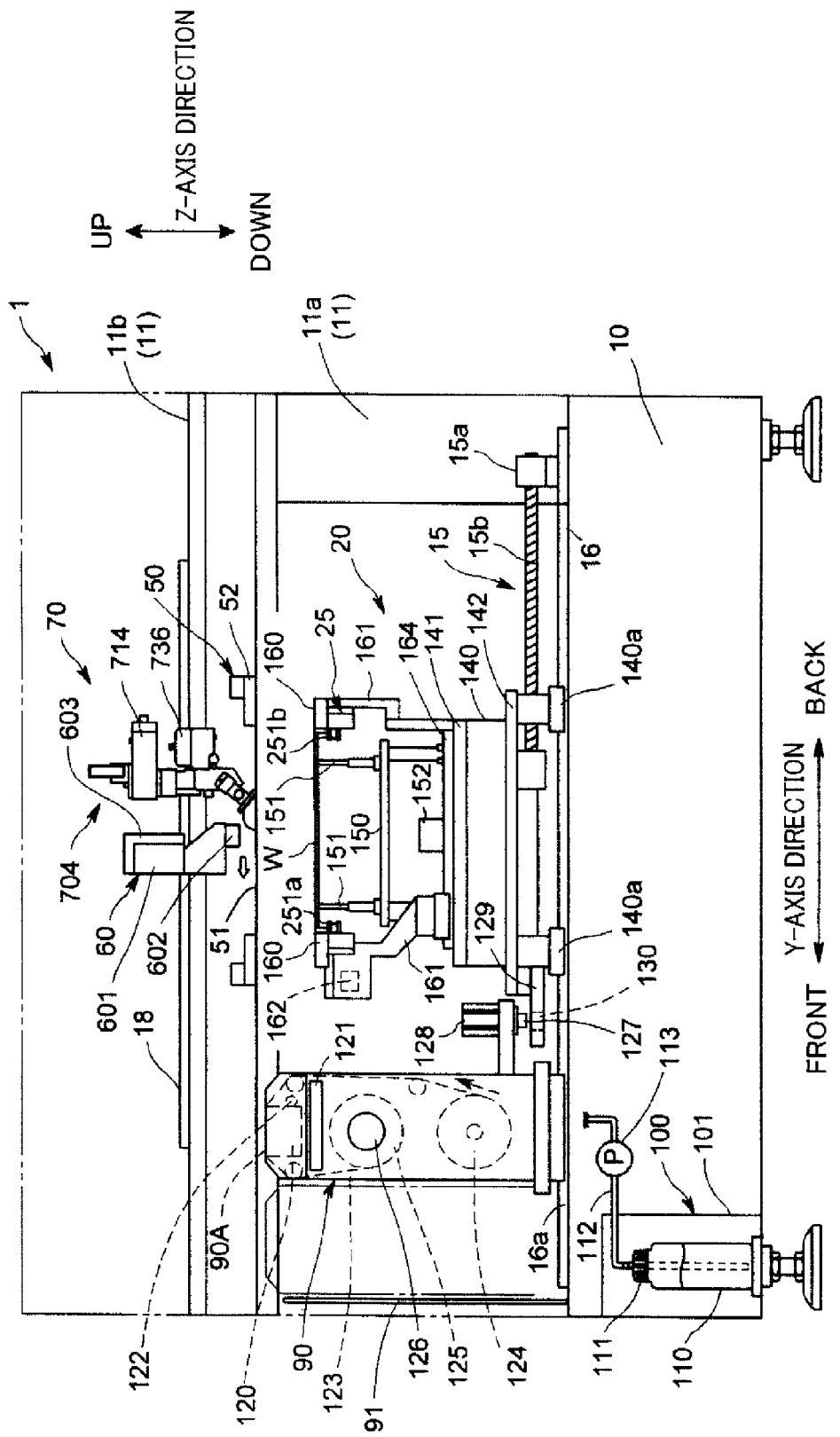
FIG. 3 is a schematic side view showing the schematic configuration of the screen printing apparatus in a state in which the mask is set.

Referring to FIG. 1 to FIG. 3, a screen printing apparatus 1 according to an embodiment includes a base 10 having a substantially square shape in plan view and a substrate table 20 movable back and forth on the base 10. Note that, in the following explanation, the left right direction, the front back direction, and the up down direction of the screen printing apparatus 1 are respectively provisionally referred to as X-axis direction, Y-axis direction, and Z-axis direction.

A frame member 11 is provided on the base 10. The frame member 11 includes column frames 11a arranged at four corners of the base 10 and a square channel-shaped upper frame 11b set to couple upper parts of the column frames 11a at the four corners and opening to face one another when viewed in the Y-axis direction.

As shown in FIG. 3, a moving mechanism 15 for moving the substrate table 20 in the Y-axis direction is provided on the base 10. The moving mechanism 15 includes a driving motor 15a, a rotating shaft of which extends along the Y-axis direction, and a ball screw mechanism 15b driven by the driving motor 15a. The ball screw mechanism 15b extends along the Y-axis direction. The front part of the ball screw mechanism 15b is coupled to a slide block 140a fixed to the bottom surface of a Y table 142. The slide block 140a enables reciprocating along the Y-axis direction. The slide block 140a is moved on a fixed rail 16 extending in the Y-axis direction on the base 10. When the driving motor 15a is activated to rotate the ball screw mechanism 15b to screw-feed the slide block 140a, the substrate table 20 is moved along the fixed rail 16 from a printing position that is set on the base 10 to correspond to a part right under a mask clamp unit 50 to a substrate conveying position that is set on the rear side of the base 10 (the right side in FIG. 3) further than the printing position.

The substrate table 20 includes a conveyor unit 25. The conveyor unit 25 includes, at the upper end, a pair of conveyors 251a and 251b capable of moving a print substrate W in the X-axis direction. The screen printing apparatus includes carrying-in conveyors 31 carrying-out conveyors 32 and a control unit 40 (see FIG. 5). The carrying-in conveyors 31, are units provided on a right side surface section of the base 10 and configured to carry the print substrate W before printing into the conveyor unit 25 of the substrate table 20 located in the substrate conveying position. The carrying-out conveyors 32 are units provided on a left side surface section of the base 10 and configured to receive the print substrate W after the printing from the conveyor unit 25 of the substrate table 20 located in the substrate conveying position and carry out the print substrate W to a downstream machine such as a mounting machine. The control unit 40 is a unit configured to control the entire screen printing apparatus. The substrate table 20, the carrying-in conveyors 31 and the carrying-out conveyors 32 are controlled to be driven by a substrate conveying mechanism control section 43 (see FIG. 5) of the control unit 40 to operate in association with one another.

Note that a Y-axis direction interval between the carrying-in conveyors 31 and a Y-axis direction interval between the carrying-out conveyors 32 can be varied by not-shown conveyor width adjusting devices independent from each other. A Y-axis direction interval between the conveyors 251a and 251b can be varied as explained below and is adjusted according to the width of the print substrate W in a set-up process before a printing start.

Referring to FIG. 3, in the substrate table 20, reference numeral 140 denotes a lifting and lowering device. The lifting and lowering device 140 is configured to be movable in the X-axis direction with respect to the Y table 142 and configured to be capable of lifting and lowering an X table 141, which is arranged in an upper part of the lifting and lowering device 140, in the Z-axis direction and capable of pivoting the X table 141 around an R axis. A pair of arm members 161 is provided at both front and rear (Y-axis direction) ends of the X table 141.

The arm member 161 on the rear side is fixed to the X table 141. The arm member 161 on the front side is provided to be slidable in the Y-axis direction by being coupled to a fixed rail 164 fixed to the X table 141 along the Y-axis direction. The conveyors 251a and 251b are respectively provided in the arm members 161 and paired. In this embodiment, a slide amount of the arm member 161 on the front side is adjusted to adjust conveyor width of the conveyors 251a and 251b to be adaptable to the substrates W having various Y-axis direction substrate widths.

The substrate table 20 includes a backup mechanism and clamp mechanisms 160.

The backup mechanism is a unit provided on the X table 141 between the arm members 161 and configured to lift the substrate W from the conveyor unit 25 and support the substrate W. The backup mechanism includes a plurality of backup pins 151 of a predetermined array and includes a backup table 150 elevatably supported on the X table 141 via a ball screw mechanism or the like and a motor 152 for driving of the ball screw mechanism and the like.

The clamp mechanisms 160 are units respectively provided in the front and rear arm members 161 and configured to hold the substrate W, which is lifted by the backup mechanism, from the front back direction according to the operation of a clamp motor 162 and fix the substrate W. The clamp mechanisms 160 are respectively provided in the front and rear arm members 161. Therefore, the clamp mechanisms 160 can accurately clamp the substrate W irrespective of the Y-axis direction substrate width of the substrate W.

Note that, in a printing process, the X table 141 is lifted by the lifting and lowering device 140. Consequently, the substrate W clamped by the clamp mechanisms 160 is lifted from the conveyor unit 25 and mounted on a mask sheet 51 of the mask clamp unit 50 explained below.

Referring to FIG. 3, the mask clamp unit 50 is provided above the substrate table 20. The mask clamp unit 50 detachably fixes the mask sheet 51 to the frame member 11 fixed to the base 10. The mask sheet 51 is a thin plate-like stencil. The mask sheet 51 is stuck to the lower surface side of a mask frame 52 according to operation by an operator. The mask frame 52 is attached to the upper frame 11b. The entire periphery of the mask sheet 51 is retained by the mask frame 52. An opening section (a pattern hole for printing), through which solder is inserted, is formed in the center of the mask sheet 51. Both front and rear outer sections of the opening section are set as a front side non-opening section, on which a solder pool Sd can be placed, and a rear side non-opening section.

A solder supply unit 60 and a printing head 704 are arranged in positions above the mask sheet 51. Sections of the solder supply unit 60 operate according to a control command from a solder supply control section 44 (see FIG. 5) of the control unit 40, whereby the solder supply unit 60 supplies solder onto the mask sheet 51. The printing head 704 moves, according to a driving command from a printing control section 45 (see FIG. 5) of the control unit 40, the solder (the solder pool Sd) on the mask sheet 51 while scraping the solder on the mask sheet 51 using a squeegee 702. According to the operation of the printing head 704, the solder is printed on the upper surface of the print substrate W via the opening section provided in the mask sheet 51. Note that a printing executing section 70 means a part on the base 10 on which the printing is executed. In the part, the mask sheet 51 and the printing head 704 related to the printing execution are arranged. Details of the configurations and the operations of the solder supply unit 60 and the printing executing section 70 are explained in detail below.

Referring to FIG. 2, in this embodiment, a substrate camera 81 for picking up an image of a plurality of fiducial marks and the like of the print substrate W is attached to be movable in the X-axis direction along a beam 12 fixed to the upper frame 11b. The substrate table 20 includes a mask camera 82. The mask camera 82 is moved in the X-axis direction in order to pick up an image of a plurality of fiducial marks (not shown in the figure) on the rear surface of the mask sheet 51 and identify the position, the type, and the like of the mask sheet 51. Since the substrate table 20 is movable in the Y-axis direction, the substrate camera 81 and the mask camera 82 can respectively pick up images of the plurality of fiducial marks and the like separated in the X-axis direction and the Y-axis direction and recognize the positions of the plurality of fiducial marks and the like.

Further, on the base 10, a cleaning unit 90 is set on the front side in the Y-axis direction of the substrate table 20. As shown in FIG. 3, on the base 10, an extension rail 16a is provided consecutively to the fixed rail 16. The extension rail 16a guides the cleaning unit 90 from a cleaning position in the center corresponding to the printing position to a standby position indicated by a solid line in FIG. 3 provided in the front of the base 10 and to a maintenance position indicated by an imaginary line (see FIG. 1) in FIG. 3 provided further in the front (on the outer side) of the standby position. Further, an opening and closing door 91 is provided in the front of the base 10 facing the standby position of the cleaning unit 90. A cleaning agent supply unit 100 for a cleaning agent is provided in the vicinity below the standby position. Note that FIG. 3 is a schematic diagram showing the external appearance of the base 10, the external appearance of the lifting and lowering device 140 and the cleaning unit 90 in a state in which a not-shown panel in the near side on the paper surface is removed, and the cross section of the print substrate W, the mask sheet 51, the printing executing section 70, and the like.

Referring to FIG. 3, in the cleaning unit 90, a cleaning head 120 is set on a support plate 121 and a not-shown spray nozzle for the cleaning agent is provided on the side of the cleaning head 120. In the cleaning head 120, a suction port configured by a slit 90A is formed on the upper surface. The slit 90A (the suction port) extends in the X-axis direction and is connected to a suction unit configured by a not-shown blower. In the cleaning unit 90, a cleaning roll 124, a winding roller 125, and a driving motor 126, configured to drive to rotate the winding roller 125, are disposed. The cleaning roll 124 is an example of a consumable item formed by winding cleaning paper 123 functioning as a cleaning sheet in a roll shape. The winding roller 125 is a member for winding the cleaning paper 123 let out from the cleaning roll 124 and tensed on the upper surface of the cleaning head 120. The driving motor 126 is configured by, for example, a servo motor.

A coupling device is configured between the cleaning unit 90 and the substrate table 20. The coupling device includes a coupling cylinder 128, which includes a coupling rod 127, and a coupling plate 129. The coupling cylinder 128 is provided in the bottom of the cleaning unit 90. The coupling plate 129 is provided on the substrate table 20. The coupling rod 127 is driven by the coupling cylinder 128 and the distal end of the coupling rod 127 is inserted into an engagement hole 130 formed in the coupling plate 129, whereby the substrate table 20 and the cleaning unit 90 are integrally coupled. In this way, the coupling device couples the substrate table 20 and the cleaning unit 90 to be capable of being engaged and disengaged.

In the cleaning unit 90, a not-shown lifting and lowering device configured to lift and lower the cleaning head 120 is arranged. During cleaning, the lifting and lowering device lifts the cleaning head 120 and presses the cleaning head 120 against the rear surface of the mask sheet 51.

The cleaning agent supply unit 100 for the cleaning agent is attached to a front side section of the base 10 and includes a casing 101, in a front section of which an opening and closing door is provided. In the casing 101, a bottle 110 for storing the cleaning agent is housed. A cap 111 is detachably attached to the top of the bottle 110. A supply pipe 112 made of a flexible pipe is connected to the cap 111. The cleaning agent in the bottle 110 is sucked from the supply pipe 112 by a pump 113. The sucked cleaning agent is supplied by the spray nozzle.

When a residual quantity of the cleaning agent runs short, the opening and closing door is opened, the cap 111 of the bottle 110 is removed, the bottle 110 in which the residual quantity of the cleaning agent runs short is taken out, and the bottle 110 storing a sufficient quantity of the cleaning agent is attached.

The configuration and the operation of the solder supply unit 60 are explained.

Referring to FIG. 1 and FIG. 3, the solder supply unit 60 includes a solder storage container 601, a solder ejection port 602, and a unit main body 603. The solder storage container 601 is a container storing solder consumed as a consumable item. The solder ejection port 602 is a member provided at the lower end of the solder storage container 601 and configured to eject the solder stored in the solder storage container 601 to the front surface of the mask sheet 51. The unit main body 603 includes a not-shown pump configured to supply the solder from the solder storage container 601 to the solder ejection port 602, a not-shown ejection motor configured to drive the pump, and a not-shown electric ejection port opening and closing valve configured to open and close the solder ejection port 602 in order to prevent the solder from dripping from the solder ejection port 602 even after the ejection motor is stopped.

The solder supply unit 60 is driven by an X-axis driving motor 604 (FIG. 5) and moves in the X-axis direction. Specifically, the X-axis driving motor 604 drives to move a not-shown frame, which supports the solder storage container 601, the ejection port 602, and the unit main body 603, in the X-axis direction along a not-shown X-axis direction frame member. The X-axis direction frame member is enabled to move in the Y-axis direction along a pair of fixed rails 18 and coupled to a below-mentioned printing head 704. The X-axis direction frame member moves in the Y-axis direction integrally with the printing head 704. The control unit 40 includes the solder supply control section 44 configured to control the X-axis driving motor 604 of the solder supply unit 60, a Y-axis driving motor for head 710 configured to drive the printing head 704 in the Y-axis direction, the ejection motor, and the ejection port opening and closing valve to eject and supply a predetermined quantity of the solder to predetermined positions in the X-axis direction and the Y-axis direction on the front surface of the mask sheet 51 at predetermined timing.

The configurations and the operations of the printing head 704 and the like arranged in the printing executing section 70 are explained.

First, referring to FIG. 3, the printing head 704 is arranged in the printing executing section 70. In this embodiment, as the printing head 704, a printing head including the single squeegee 702 (see FIG. 4 and FIG. 7) extending in the X-axis direction as described in, for example, Japanese Patent Application Laid-Open No. 2007-136960 is used. Specifically, the printing head 704 is as explained below.

Figure 4:
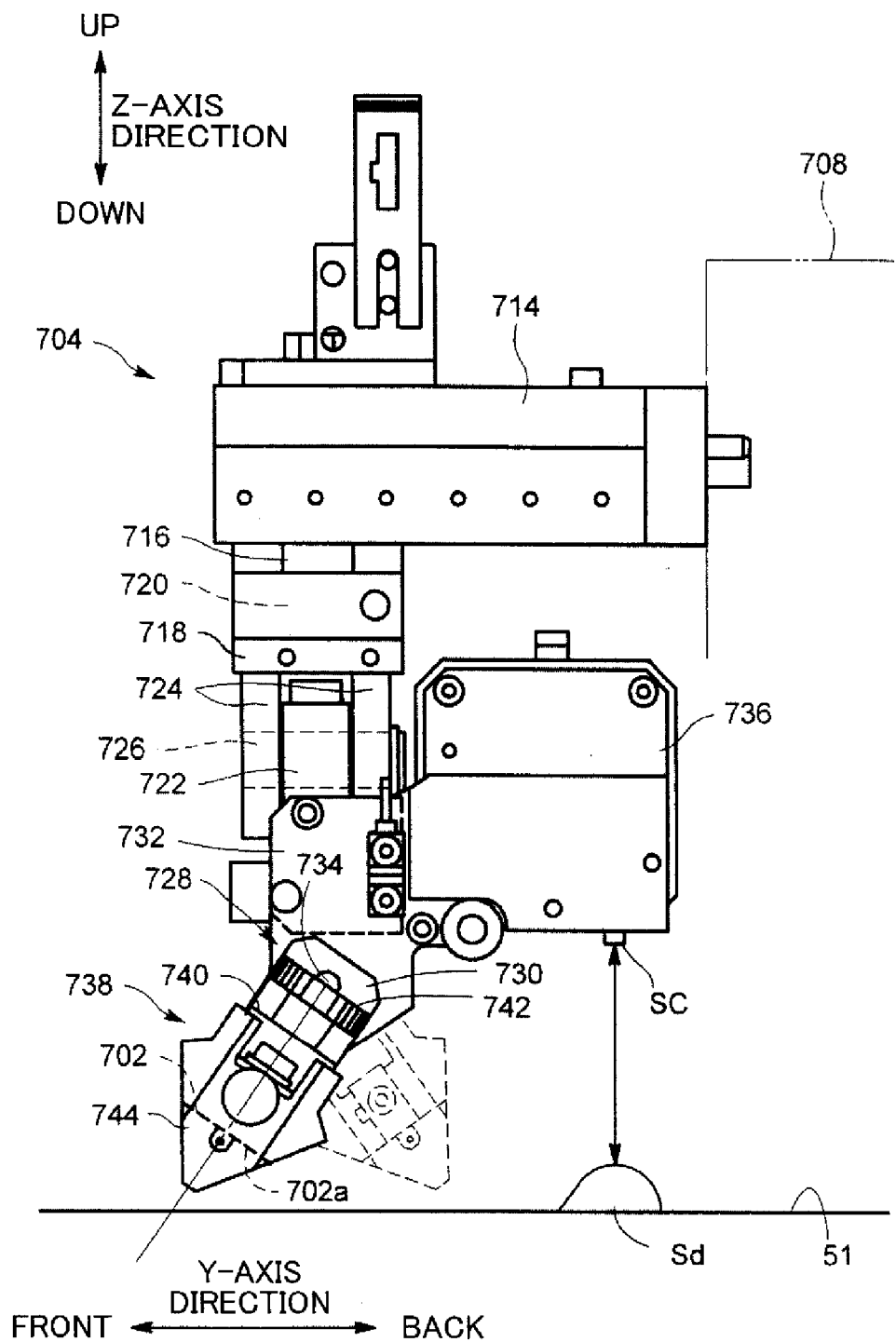
FIG. 4 is a side view showing the specific configuration of a printing head.

Referring to FIG. 4 as well, the printing head 704 includes a head support member 708, a main frame 714, a slide column 716, a support plate 718, a pair of hanging sections 724, a first support shaft 726, and a unit assembly section 728. The head support member 708 is a member laid and suspended to be movable in the Y-axis direction along a pair of fixed rails 18 and driven to move in the Y-axis direction with the Y-axis driving motor for head 710 (FIG. 5) configured by a servo motor. The main frame 714 is a structure fixed to the head support member 708. The slide column 716 is a member extending to the lower side of the main frame 714, supported movably in the Z-axis direction relatively to the main frame 714, and driven to move in the Z-axis direction by a Z-axis driving motor for head 712 (FIG. 5) configured by a servo motor. The support plate 718 is a member provided on the lower side of the slide column 716 via a load sensor 720 such as a load cell. The pair of hanging sections 724 is a support member provided in a lower part (the lower surface) of the support plate 718. The first support shaft 726 is a member configured to axially support a sub-frame 722 of the unit assembly section 728 that pierces through the hanging sections 724 in the Y-axis direction and is arranged between the hanging sections 724.

The unit assembly section 728 includes the sub-frame 722, a gear box 732 integrally assembled with the sub-frame 722, a motor for squeegee pivoting 736 (see FIG. 5) attached to the gear box 732, a second support shaft 734 extending in the X-axis direction piercing through the sub-frame 722 and pivotably supported at the lower end of the sub-frame 722, a squeegee support unit 730 fixed to the second support shaft 734 at both ends, and a squeegee assembly 738 detachably attached to the squeegee support unit 730.

In the gear box 732, a not-shown input shaft and a not-shown output shaft and a not-shown speed reducing gear train configured to couple the input shaft and the output shaft are provided. A not-shown output shaft of the motor for squeegee pivoting 736 is coupled to the input shaft. Teethed pulleys are respectively fixed to the output shaft of the gear box 732 and the second support shaft 734. A teethed belt is laid over between both of the teethed pulleys.

The squeegee assembly 738 includes a squeegee 702, a squeegee holder 740 configured to hold the squeegee 702, and a horizontal leakage prevention plate 744 pivotably attached at both ends of the squeegee holder 740. The squeegee holder 740 is screwed in and mounted on the squeegee support unit 730 by a screw fitting a nut member 742 with knobs to respective screw shafts.

The second support shaft 734, the squeegee support unit 730, and the squeegee assembly 738 are integrally pivoted according to the driving by the motor for squeegee pivoting 736. An angle (an attack angle) in a traveling direction side of the squeegee 702 between the substrate W pressed by the squeegee 702 via a mask and a work surface 702a of the squeegee 702 can be set to a predetermined angle equal to or smaller than 90 degrees. The solder in the traveling direction of the squeegee 702 can be scraped off using the same work surface 702a in both of a forward printing process for moving the squeegee 702 from the front side to the rear side in the Y-axis direction to perform printing and a backward printing process for moving the squeegee assembly 738 from the Y-axis direction rear side to the front side in a state in which the squeegee assembly 738 is inclined to the front side as shown in FIG. 3.

The horizontal leakage prevention plate 744 prevents the solder from horizontally leaking from the squeegee 702 outward in the X-axis direction during printing.

As explained in detail below, during the forward printing process and the backward printing process, the printing control section 45 of the control unit 40 feedback-controls the Z-axis driving motor for head 712, which enables the slide column 716 to move in the Z-axis direction with respect to the main frame 714, in order to match a detected load of the load sensor 720 to a target printing load (a load of the squeegee 702 pressing the print substrate W and a clamp piece via the mask sheet 51).

Note that a solder sensor SC is attached to the lower surface of the motor for squeegee pivoting 736. The solder sensor SC detects a solder pool gathered and held up on the surface of the mask sheet 51 below the solder sensor SC by the squeegee 702. A signal indicating a measurement result of the solder pool by the solder sensor SC is input to an input and output control section 47. In this way, in this embodiment, the sensor SC functions as "a solder quantity measuring section" of the present disclosure.

Figure 5:
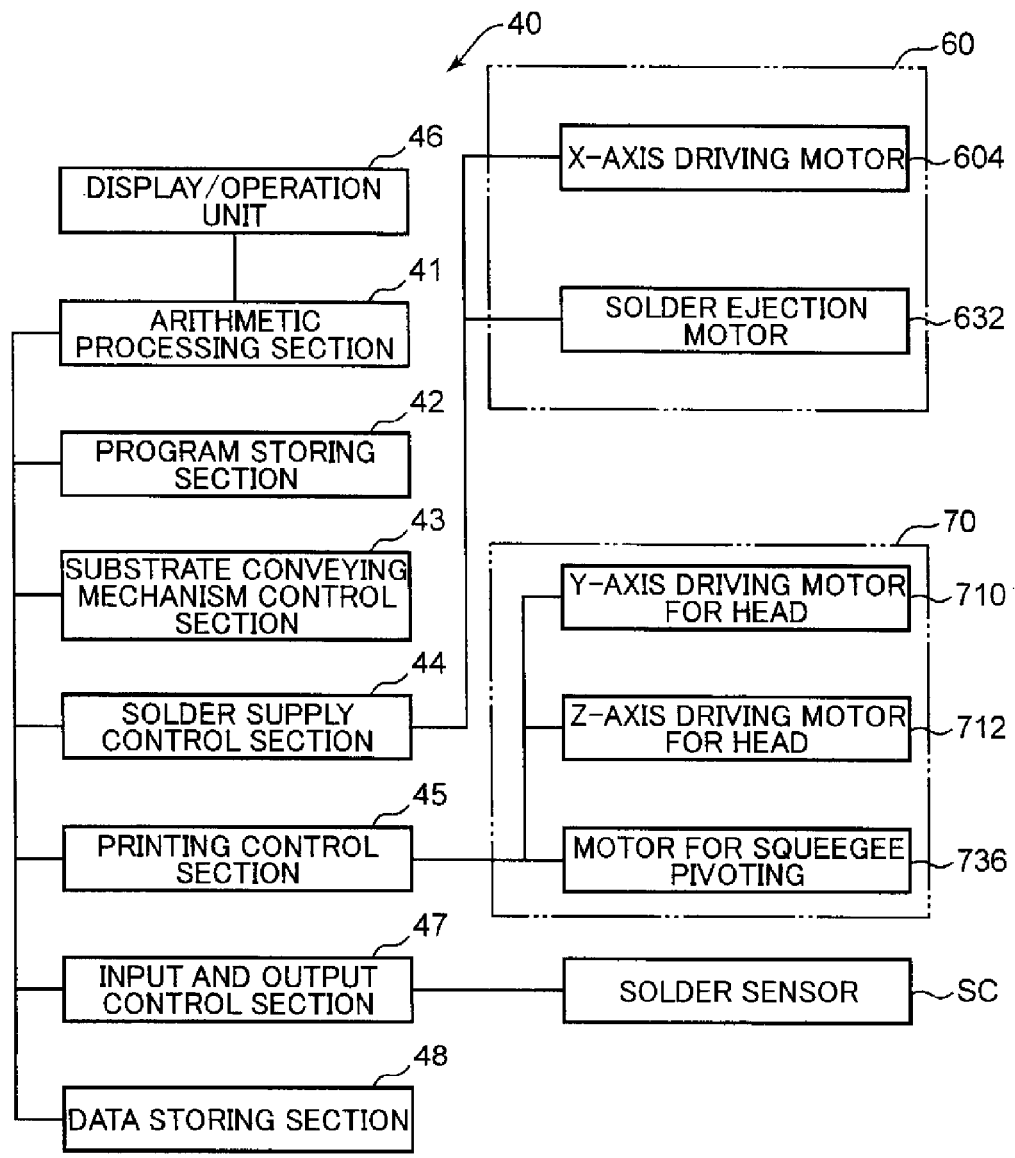
FIG. 5 is a block diagram showing the main schematic configuration of the screen printing apparatus.

Referring to FIG. 5, the control unit 40 includes an arithmetic processing section 41, a program storing section 42, the substrate conveying mechanism control section 43, the solder supply control section 44, and the printing control section 45.

The arithmetic processing section 41 is configured by a CPU or the like. The arithmetic processing section 41 controls the sections of the screen printing apparatus 1 and repeatedly performs printing according to a printing program stored in the program storing section 42 in advance. As explained below in detail, a program for managing residual quantities of various consumable supplies (the cleaning paper 123, the cleaning agent, and the solder) is included in programs stored in the program storing section 42. A print-execution count section configured to count the number of times of print-execution Np of the printing executing section 70 and an updating section configured to update, based on the number of times of print-execution Np counted by the print-execution count section, residual quantities Pq, Lq, and Sq of the cleaning paper 123, the cleaning agent, and the solder are functionally configured according to the program.

The substrate conveying mechanism control section 43 controls actuators such as various motors and an air cylinder incorporated in the substrate table 20 and performs carry-in and carry-out of the print substrate W by the conveyors 251*a* and 251*b*, positioning of the print substrate W with respect to the mask sheet 51, and the like.

As explained in detail below, the solder supply control section 44 controls the solder supply unit 60 and performs supply of the solder to the mask sheet 51.

Further, the printing control section 45 controls the operation of the squeegee 702 via the printing head 704.

Note that reference numeral 46 in the figure denotes a display/operation unit functioning as a prediction-result informing section. As it is well known, the display/operation unit 46 includes a display and a pointing device such as a keyboard and includes a function of displaying, on the display, a printing program, an error message, printable numbers of print substrates Q(P), Q(L), and Q(S) explained below, a printable time, and the like or a function that an operator can operate in order to input various data and information such as commands to the control unit 40 based on displayed information.

Reference numeral 47 denotes an input and output control section. The input and output control section 47 receives a detection result of a solder sensor or the like, which detects the solder on the mask sheet 51, and gives the detection result to the arithmetic processing section 41.

Reference numeral 48 denotes a data storing section. The data storing section 48 includes an auxiliary storage device configured by a nonvolatile memory or the like. Data necessary for the control of the sections is stored in the data storing section 48. The data storing section 48 is configured to store a limit solder quantity with which printing quality can be secured, an initial solder ejection quantity for supplying the solder onto the mask sheet 51 in a below-mentioned preparation process, a solder decrease quantity consumed in one printing, a solder quantity measured in a solder quantity measuring process, a solder residual quantity calculated based on a solder quantity, and the like. Further, in the data storing section 48, a number RN of the print substrates W printed after the execution of the wet type cleaning is stored as a reference value with respect to printing processing executed last time, setting to zero the number of times of dry type cleaning of final execution.

Further, the control unit 40 according to this embodiment configures a residual quantity obtaining section configured to obtain residual quantities of the consumable supplies (the cleaning paper 123 and the cleaning agent) consumed by the cleaning unit 90, a processable quantity predicting section configured to predict, based on the residual quantity obtained by the residual quantity obtaining section, before operation of the printing executing section, the printable numbers of print substrates Q(P), Q(L), and Q(S) respectively related to the consumable supplies; the cleaning paper 123, the cleaning agent, and the solder, a prediction-result informing section for information of a prediction-result by the processable quantity predicting section, a determining section configured to determine whether the printable numbers of print substrates Q(P), Q(L), and Q(S) predicted by the processable quantity predicting section reach a produced number of the print substrates W produced per one lot, or a determination result notifying section for notifying the user of necessary information based on a determination result of the determining section.

These functions are functions for predicting the printable numbers of print substrates Q(P), Q(L), and Q(S)) based on the residual quantities Pq, Lq, and Sq of the consumable supplies or determining whether residual quantities of the consumable supplies necessary for one lot are sufficient. By attaining such functions, it is possible to increase an operating ratio of the screen printing apparatus 1 as much as possible.

The functions are explained in detail below. Note that, in the following explanation, the consumable supplies are identified by P (the cleaning paper 123), L (the cleaning agent), and S (the solder). For example, printable numbers of print substrates explained below are respectively different according to consumable supplies to be evaluated. Therefore, a print executable number based on the cleaning paper 123 is represented as Q(P), a print executable number based on the cleaning agent is represented as Q(L), and a print executable number based on the solder is represented as Q(S).

First, the consumable supplies of the cleaning unit 90 are explained.

Every time the number of the print substrates W subjected to printing reach a predetermined number, the cleaning unit 90 actuates the cleaning head 120 and the like and cleans the rear surface of the mask sheet 51. This operation of a unit based on the number of times of print-execution (processed number) of the print substrates W is referred to as "cleaning operation" or simply referred to as "cleaning".

The cleaning paper 123 is supplied by loading of the cleaning roll 124, let out from the cleaning roll 124, and consumed. Total length of a portion that can be used for the cleaning of a new cleaning roll 124 is represented by Pnew as a quantity in the case of a new cleaning roll.

The cleaning unit 90 in this embodiment is configured to be capable of alternately executing so-called dry type cleaning and wet type cleaning. This is because, if the wet type cleaning is executed every time the cleaning operation is performed, the cleaning agent excessively adheres to the rear surface of the mask sheet 51, deteriorates printing quality, and affects the life of the mask sheet 51.

Figure 6:
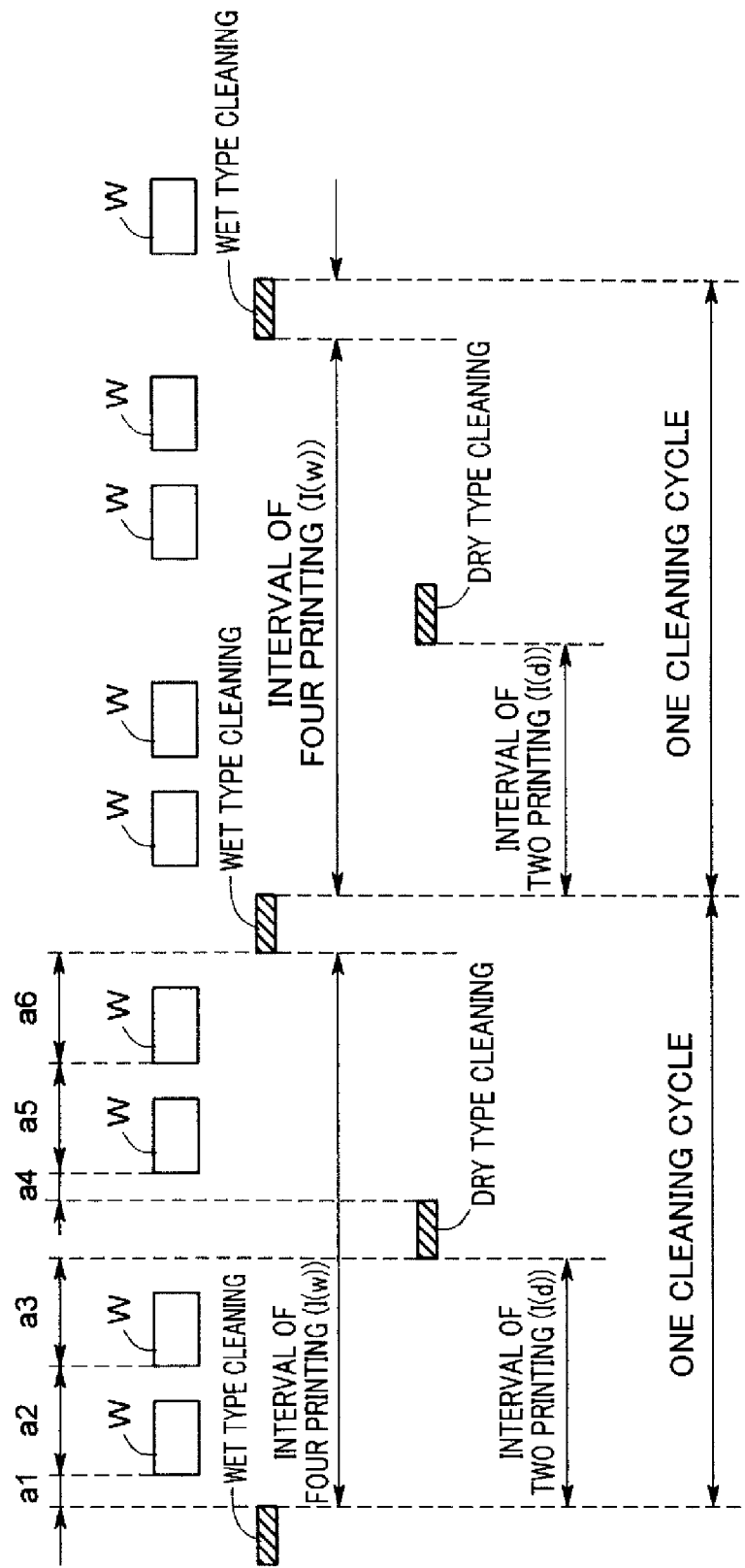
FIG. 6 is an explanatory diagram showing execution intervals of wet type cleaning and dry type cleaning.

Referring to FIG. 6, as an example of a preferred printing form, for example, the "wet type cleaning" performed using the cleaning agent is executed at an interval of four printings from a first printing operation and the "dry type cleaning" performed without using the cleaning agent is executed at an interval of two printings from a timing when the wet type cleaning is executed.

The number of printings in "an interval of four printings" shown in FIG. 6 refers to a number of the print substrates W printed between one wet type cleaning and the next wet type cleaning. In other words, this number of printings is an index representing a frequency in executing the wet type cleaning. For convenience, the number of the four-print substrate W is referred to as execution interval of the wet type cleaning and is designated by I(w). Similarly, the number of printings in "an interval of two printings" in the figure refers to the number of the print substrates W printed between the wet type cleaning and the next dry type cleaning. For convenience, the number of the two-print substrates W is referred to as an execution interval of the dry type cleaning and is represented by I(d). A cycle from timing of an end of a certain wet type cleaning to timing of an end of the next wet type cleaning is referred to as one cleaning cycle.

As a constraint of the cleaning unit 90, I(d)<I(w) is set. That is, the dry type cleaning is carried out between the wet type cleaning and the next wet type cleaning.

In both of the dry type cleaning and the wet type cleaning, a plurality of wiping operations is sometimes executed in one cleaning operation. The "wiping operation" is an operation performed once when the cleaning head 120 moves from one side to the other side along the Y-axis direction. The number of times of the wiping operation is set as the number of times of wiping and represented by WP.

In this embodiment, the wiping operation for one reciprocating movement (WP=2) is executed in one cleaning operation. One dry type cleaning is always carried out between certain wet type cleaning and the next wet type cleaning. Concerning the cleaning paper 123, a quantity required for one wiping operation (WPqd in the dry type cleaning and WPqw in the wet type cleaning: WPqd and WPqw are hereinafter also referred to as "consumptions") is a known value determined according to control of the driving motor 126. Similarly, a consumption of the cleaning agent required in one wiping operation (0 in the dry type cleaning and WLqw in the wet type cleaning) is a known value determined according to the specifications or the like of a spray nozzle 122.

A residual quantity Pq of the cleaning paper 123 is represented by length (mm) of the cleaning paper 123 remaining in the cleaning roll 124.

In this embodiment, the residual quantity Pq of the cleaning paper 123 is calculated by a calculation of the control unit 40.

As a calculation method, various forms can be adopted. In this embodiment, a method of estimating the residual quantity Pq based on the number of times of the cleaning operation of the wet type cleaning (a cleaning count number of times) N(C) without depending on a sensor is adopted.

For example, the number of times N(C) of the cleaning operation of the wet type cleaning executed after a new cleaning roll 124 is loaded (the number of times of the wiping operation is 2N(C) for reciprocating movement) is counted. The residual quantity Pq can be calculated as follows:

$$Pq = Pnew - (WPqd + WPqw) \times 2N(C) \tag{1}$$

When a residual quantity before execution of cleaning can be detected using a sensor or the like, a consumption may be recursively updated from the residual quantity.

Further, when the number of times N(PNewC) of the cleaning operation of the wet type cleaning usable in a new cleaning roll is known, the residual quantity Pq may be calculated as follows:

$$Pq = 2 \times (WPqd + WPqw) \times (N(PNewC) - N(C)) \tag{2}$$

According to such a calculation, the control unit 40 configures a residual quantity obtaining section configured to obtain, before the operation of the printing executing section, a residual quantity of the cleaning paper 123 consumed as a consumable item by the cleaning unit 90.

In the following explanation, a print executable number Q(P) at the residual quantity Pq is calculated based on the residual quantity Pq of the cleaning paper 123.

If the print executable number Q(P) at a certain residual quantity Pq of the cleaning paper 123 is calculated, the user can determine whether the cleaning roll 124 should be replaced before the operation of the screen printing apparatus 1. Therefore, in this embodiment, a program for calculating the print executable number Q(P) at the residual quantity Pq of the cleaning paper 123 is executed.

In the one cleaning cycle of the wet type cleaning, each of the wet type cleaning and the dry type cleaning is carried out once. Length of the cleaning paper 123 consumed in the cleaning operation in the one cleaning cycle is 2×(WPqd+WPqw).

An initial state of production start timing of the screen printing apparatus is various depending on end timing during the last production. Therefore, in the following explanation, for convenience, production is started in periods a1 to a6 shown in FIG. 6.

First, it is assumed that the residual quantity Pq remaining when the production start timing is the period a1 shown in FIG. 6 (a period from time immediately after the wet type cleaning is carried out to a start of printing of a first print substrate) is obtained by a calculation. Based on the residual quantity Pq, the following expression is calculated to obtain a quotient and a remainder:

$$Pq/2 \times (WPqd + WPqw) \tag{3}$$

When the quotient is A and the remainder is B, printing is executable for at least A×I(w) print substrates. The quotient A is the number of times uN(P) of the wet type cleaning executable with the residual quantity Pq. The number of times uN(P) is also the number of cleaning cycles executable with the residual quantity Pq. In this way, in this embodiment, the number of times uN(P) is calculated and (P) the print executable number Q(P) is calculated according to the quotient and the remainder of the number of times uN(P), in other words, based on the number of times uN of the wet type cleaning calculated as the number of cleaning cycles.

In this case, when B<2×WPqd is satisfied, after the wet type cleaning carried out after the printing of A×I(w) print substrates ends, the dry type cleaning cannot be performed. Therefore, after the last wet type cleaning, the number of printings for which printing is further executable is I(d). That is, the print executable number Q(P) is calculated as follows:

$$Q(P) = A \times I(w) + I(d) \tag{4}$$

On the other hand, where B>2×WPqd is satisfied, after the last wet type cleaning, the dry type cleaning can be further performed. Printing on the print substrate W can also be performed before the next wet type cleaning. Therefore, the print executable number Q(P) is calculated as follows:

$$Q(P) = A \times I(w) + I(w) \tag{5}$$
$$= (A + 1) \times I(w).$$

It is assumed that the residual quantity Pq remaining when the production start timing is the period a2 shown in FIG. 6 is obtained by a calculation. This period is during printing or after printing on the print substrate W. The print substrate W in this period is not added to the print executable number.

When Expression (3) Pq/2×(WPqp+WPqw) is calculated and a quotient is A and a remainder is B as explained above, a first one print substrate is not added to the print executable number. Therefore, printing is executable for at least {A×I(w)−1} print substrates. In this case, when B<2WPqd is satisfied, after the last wet type cleaning, the number of printings for which printing is further executable is I(d). Therefore, the print executable number Q(P) is calculated as follows:

$$Q(P) = A \times I(w) + I(d) - 1 \qquad (6).$$

On the other hand, where B>2WPqd is satisfied, the print executable number Q(P) is $$Q(P) = \{A \times I(w) - 1\} + I(w) \qquad (7)$$
$$= (A+1) \times I(w) - 1.$$

It is assumed that the residual quantity Pq remaining when the production start timing is the period a3 shown in FIG. 6 is obtained by a calculation. In this case, the print executable number Q(P) branches according to the magnitude of the remainder B of Expression (3). When B<2WPqd is satisfied, the print executable number Q(P) is calculated as follows:

$$Q(P) = A \times I(w) + I(d) - 2 \qquad (8).$$

When B>2WPqd is satisfied, the print executable number Q(P) is calculated as follows:

$$Q(P) = (A+1) \times I(w) - 2 \qquad (9).$$

It is assumed that the residual quantity Pq remaining when the production start timing is the period a4 shown in FIG. 6 is obtained by a calculation. In this case, in the first one cleaning cycle, the dry type cleaning is already finished and two print substrates can be printed before at least the first wet type cleaning. On the other hand, 2×WPqw is used for the first wet type cleaning. Therefore, if Pq<2×WPqw is satisfied, the wet type cleaning cannot be performed, and the print executable number is two. On the other hand, if Pq>2WPqw is satisfied, 2WPqw is consumed in the first wet type cleaning. Thereafter, 2×(WPqd+WPqw) is consumed at every one cleaning cycle until the next wet type cleaning. Therefore, the following expression is calculated to obtain a quotient and a remainder:

$$(Pq - 2WPqw)/2 \times (WPqd + WPqw) \qquad (10).$$

In Expression (10), when the quotient is A and the remainder is B, since the number of printings of two before the first wet type cleaning is added, printing is executable for at least {A×I(w)+2} print substrates. Further, when B<2WPqd is satisfied, as in the case of Expression (5), the dry type cleaning cannot be performed after the last wet type cleaning and the number of printings for which printing is further executable is I(d). Therefore, the print executable number Q(P) is calculated as follows:

$$Q(P) = A \times I(w) + I(d) + 2 \qquad (11).$$

On the other hand, where B>2WPqd is satisfied, the print executable number Q(P) is calculated as follows:

$$Q(P) = \{A \times I(w) + 2\} + I(w) \qquad (12)$$
$$= (A+1) \times I(w) + 2.$$

Suppose the residual quantity Pq remaining when the production start timing is the period a5 shown in FIG. 6 is obtained by a calculation. This period is during printing or after printing on the print substrate W. The print substrate W in this period is not added to the print executable number. As in the case of the calculation of the residual quantity Pq in the period a4, the wet type cleaning cannot be performed if Pq<2WPqw is satisfied. The print executable number is one. If Pq>2WPqw is satisfied, Expression (10)

$$(Pq - 2WPqw)/2 \times (WPqd + WPqw)$$

is calculated to obtain a quotient and a remainder. When the quotient is A and the remainder is B, since one printing time before the first wet type cleaning is added, printing is executable for at least {A×I(w)+1} print substrates. In this case, when B<2WPqd is satisfied, the dry type cleaning cannot be performed after the wet type cleaning. The number of printings for which printing is further executable is I(d). Therefore, the print executable number Q(P) is calculated as follows:

$$Q(P) = A \times I(w) + I(d) + 1 \qquad (13).$$

On the other hand, where B>2WPqd is satisfied, the print executable number Q(P) is calculated as follows:

$$Q(P) = \{A \times I(w) + 1\} + I(w) \qquad (14)$$
$$= (A+1) \times I(w) + 1.$$

It is assumed that the residual quantity Pq remaining when the production start timing is the period a6 shown in FIG. 6 is obtained by a calculation. This period is during printing or after printing on the print substrate W. The print substrate W in this period is not added to the print executable number. As in the case of the calculation of the residual quantity Pq in the period a4, the wet type cleaning cannot be performed if Pq<2WPqw is satisfied. The print executable number is zero. If Pq>2WPqw is satisfied, Expression (10), which is (Pq−2WPqw)/2×(WPqd+WPqw), is calculated to obtain a quotient and a remainder. When the quotient is A and the remainder is B, since one printing time before the first wet type cleaning is added, printing is executable for at least A×I(w)+1 print substrates. In this case, when B<2WPqd is satisfied, the dry type cleaning cannot be performed after the wet type cleaning. The number of printings for which printing is further executable is I(d). Therefore, the print executable number Q(P) is calculated as follows:

$$Q(P) = A \times I(w) + I(d) \qquad (15).$$

On the other hand, where B>2WPqd is satisfied, the print executable number Q(P) is calculated as follows:

$$Q(P) = A \times I(w) + I(w) \qquad (16).$$

Consequently, the control unit 40 can function as a processable quantity predicting section configured to predict the print executable number Q(P) based on the residual quantity of the cleaning paper 123 obtained by the residual quantity obtaining section and prediction-result informing section configured to inform a prediction-result by the processable quantity predicting section.

Further, the control unit 40 is configured to determine whether the calculated print executable number Q(P) reaches a scheduled number N of the print substrates W produced in one lot and displays, based on a result of the determination, information necessary for the user on the display/operation unit 46.

Next, the cleaning agent is explained.

The cleaning agent is consumed by being pumped up from the bottle 110. In this embodiment, basically, when the entire volume of the bottle 110 is new, a quantity that can be used for cleaning in the entire volume is represented by Lnew.

When a cleaning operable number of times N(BnewC) of the wet type cleaning performed when the entire volume of the bottle 110 is new (the number of times of the wiping operation is 2N(BnewC) for reciprocating movement) is known, if a quantity consumed for the wiping operation in one wet type cleaning is represented as WLqw, the residual quantity Lq of the cleaning agent can be calculated as follows in the same manner as Expressions (3) and (4) in the case of the cleaning paper 123:

$$Lq = Lnew - WLqw \times 2N(C) \quad (17); \text{ and}$$

$$Lq = 2WLqw \times (N(BnewC) - N(C)) \quad (18).$$

However, a form of use of the bottle 110 is not limited to a form of replacing an emptied bottle 110 with a new bottle 110 and may be a form of only refilling the same bottle 110 with the cleaning agent. In that case, a residual quantity in the bottle 110 may be detected with a sensor and recursively updated.

The cleaning agent is used only in the case of the wet type cleaning. The quantity WLqw required for one wiping operation is known. Therefore, the print executable number Q(L) at a certain residual quantity Lq can be calculated as explained below.

Note that, in the following explanation, as in the case of the cleaning paper 123, the calculation of the print executable number Q(L) is explained for each the production start timings.

First, it is assumed that the residual quantity Lq remaining when the production start timing is the period a1 shown in FIG. 6 (the period from time immediately after the wet type cleaning is carried out to a start of printing of a first print substrate) is obtained by a calculation. Based on the residual quantity Lq, the following expression is calculated:

$$Lq/2WLqw \quad (19).$$

When a quotient is C and a remainder is D, printing is executable for at least C×I(w) print substrates. After the last wet type cleaning, the number of printings for which printing is further executable is I(w). Therefore, the print executable number Q(L) is calculated as follows:

$$Q(L) = (C+1) \times I(w) \quad (20).$$

It is assumed that the residual quantity Lq remaining when the production start timing is the period a2 shown in FIG. 6 is obtained by a calculation. This period is during printing or after printing on the print substrate W. The print substrate W in this period is not added to the print executable number. According to Expression (19), when the quotient is C and the remainder is D, the first one print substrate is not added to the print executable number. Therefore, printing is executable for at least {C×I(w)−1} print substrates. After the last wet type cleaning, the number of printings for which printing is further executable is I(w). Therefore, the print executable number Q(L) is calculated as follows:

$$Q(L) = \{C \times I(w) - 1\} + I(w)$$
$$= (C+1) \times I(w) - 1. \quad (21)$$

It is assumed that the residual quantity Lq remaining when the production start timing is the period a3, during the dry type cleaning, or the period a4 shown in FIG. 6 is obtained by a calculation. In these periods, according to Expression (19), when the quotient is C and the remainder is D, the print executable number Q(L) is calculated as follows:

$$Q(L) = (C+1) \times I(w) - 2 \quad (22).$$

It is assumed that the residual quantity Lq remaining when the production start timing is the period a5 shown in FIG. 6 is obtained by a calculation. This period is during printing or after printing on the print substrate W. The print substrate W in this period is not added to the print executable number. In this period, according to Expression (19), when the quotient is C and the remainder is D, the print executable number Q(L) is calculated as follows:

$$Q(L) = (C+1) \times I(w) - 3 \quad (23).$$

It is assumed that the residual quantity Lq remaining when the production start timing is the period a6 shown in FIG. 6 is obtained by a calculation. This period is during printing or after printing on the print substrate W. The print substrate W in this period is not added to the print executable number. In this period, according to Expression (19), when the quotient is C and the remainder is D, the print executable number Q(L) is calculated as follows:

$$Q(L) = (C+1) \times I(w) - 4 \quad (24).$$

Concerning a solder volume in a not-shown solder storage container of the solder supply unit 60, a solder volume at the time of a new solder storage container is represented as Snewθ. The print executable number Q(S) can be calculated by measuring a consumption for each printing operation according to a driving quantity or the like of a not-shown ejection motor.

On the other hand, concerning the solder pool Sd, first, the solder is supplied onto the mask sheet 51 by the solder supply unit 60, a solder quantity of the solder pool Sd after set-up work including trial printing and before a printing start is represented as Mnew, and a quantity supplied in a below-mentioned solder pool check processing sub-routine is represented as S(M).

Figure 7:
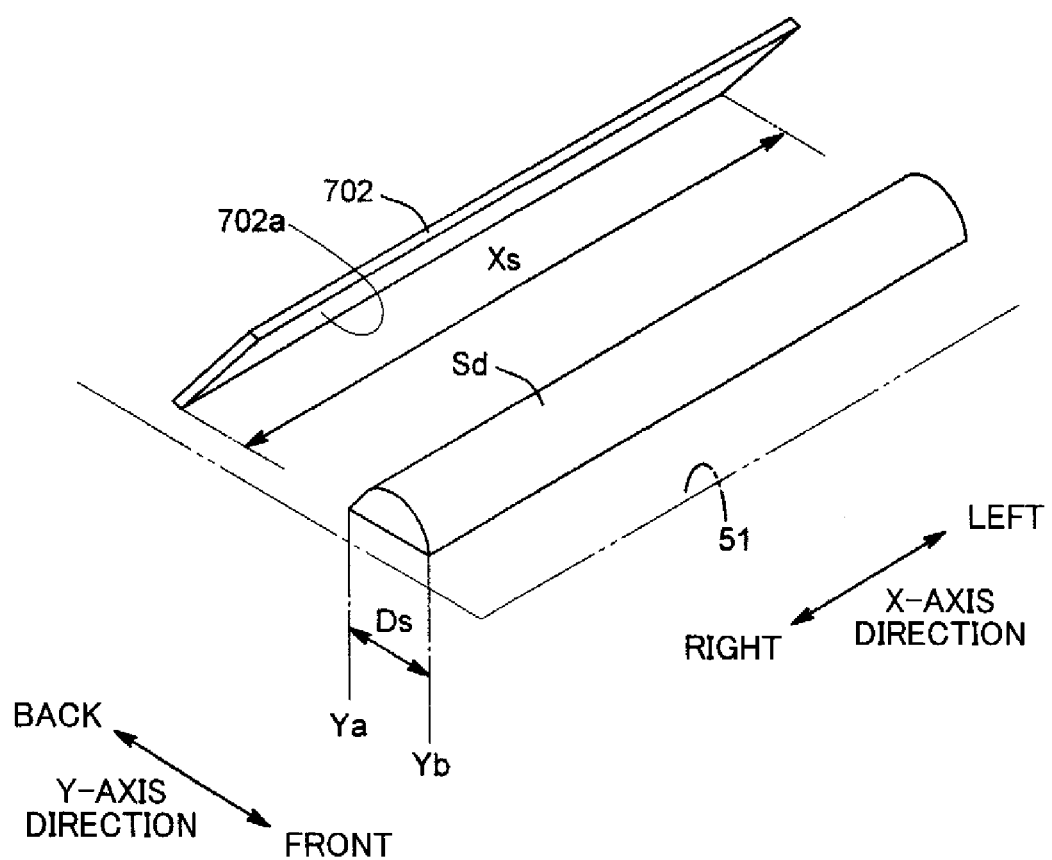
FIG. 7 is an explanatory diagram of a solder pool in the screen printing apparatus shown in FIG. 1.

The solder supplied onto the mask sheet 51 first from the solder storage container is spread in the X-axis direction and collected in the Y-axis direction by the squeegee 702 according to a plurality of times of printing. As shown in FIG. 7, on the mask sheet 51, the solder changes to a semi-cylindrical shape having a generally semicircular cross section when viewed in the X-axis direction. The length of the semi-cylindrical solder pool Sd is length Xs of the squeegee 702, both sides of which are held by the horizontal leakage prevention plate 744. Therefore, at a predetermined timing after printing, solder heights in positions obtained by scanning the solder pool Sd along the Y-axis direction are detected by the sensor SC. A residual quantity of Mq of the solder pool Sd can be calculated from a product of a sectional area of the semi-cylindrical shape and the length Xs in the X-axis direction.

If the residual quantity of Mq of the solder pool Sd is known, thereafter, it is possible to calculate the print executable number Q(M) for each solder pool Sd from the consumption Ws for each printing operation.

If the printable numbers of print substrates Q(P), Q(L), Q(S), and Q(M) in the consumable supplies P, S, and L are known, it is also possible to calculate printable times T(P), T(L), T(S), and T(M) by multiplying the printable numbers of print substrates Q(P), Q(L), Q(S), and Q(M) with unit times thereof.

Next, the operation of the screen printing apparatus 1 according to this embodiment is explained.

In the screen printing apparatus 1 configured as explained above, the Y-axis direction interval between the carrying-in conveyors 31 the Y-axis direction interval between the conveyors 251a, 251b, and the Y-axis direction interval between the carrying-out conveyors 32 are adjusted according to the width of the print substrate W in the set-up process before the printing start. A desired squeegee 702 is assembled in the squeegee holder 740. The squeegee holder 740 is assembled in the unit assembly section 728. The mask frame 52, to which a new mask sheet 51 is stuck by the operator, is fixedly arranged in the frame member 11 by the mask clamp unit 50. The solder supply unit 60 supplies an appropriate quantity (the solder quantity Mnewθ) of the solder onto the fixed mask sheet 51.

Subsequently, trial printing is carried out on a substrate-like plate for trial printing during set-up. In the trial printing, the solder supplied onto the mask sheet 51 is spread in the X-axis direction. After the trial printing, the solder pool Sd is formed on the mask surface.

In the data storing section 48 of the control unit 40, the residual quantity Sq of the solder quantity S stored in the solder storage container 601 of the solder supply unit 60, a solder quantity Mnewθ consumed during the set-up (a solder quantity consumed by the trial printing and a solder quantity that adheres to the squeegee 702 and cannot be used for printing), and the like are stored. The solder quantity Mnew is obtained by measuring, using the sensor SC, an initial solder pool Sd formed on the mask sheet 51 after the trial printing.

When the solder storage container 601 is new, the residual quantity Sq is Snewθ. A solder quantity obtained by subtracting a solder quantity consumed during the step-up from the solder volume Snewθ of the new solder storage container is a solder quantity that can be actually supplied during printing. The solder quantity is newly referred to as solder volume Snew. The solder volume Snew can be calculated by subtracting the solder quantity Mnewθ consumed during the set-up from the quantity Snewθ at the time of the new solder storage container 601.

In this way, when a printing preparation process is completed, the arithmetic processing section 41 controls the sections of the screen printing apparatus according to a printing program stored in the program storing section 42 in advance to alternately switch and execute the forward printing process and the backward printing process.

Figure 8:
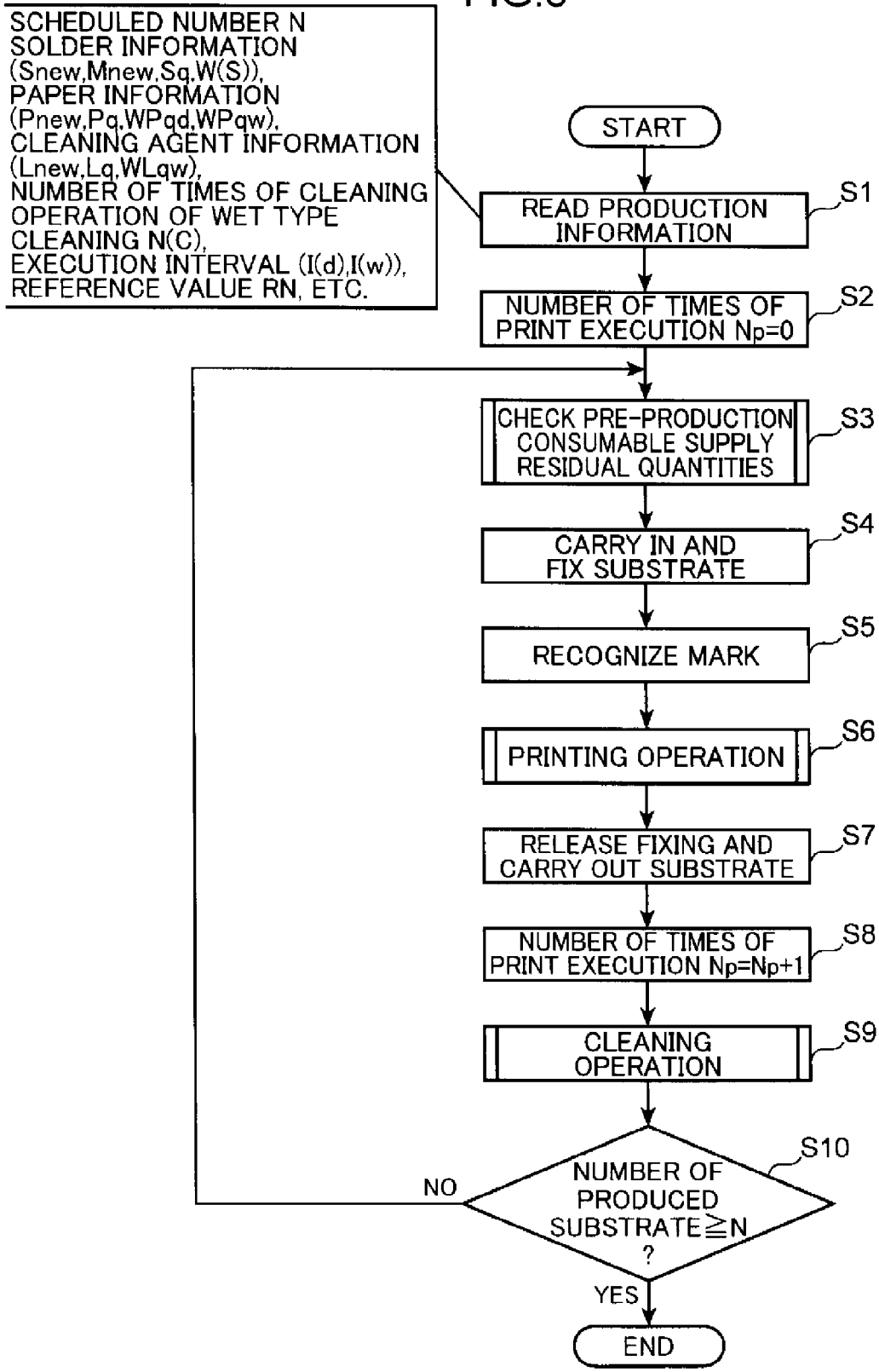
FIG. 8 is a flowchart for explaining a main routine of the operation of the screen printing apparatus shown in FIG. 1.

Referring to FIG. 8, when the screen printing apparatus 1 operates, first, the control unit 40 executes a reading process for production information (step S1). Information read in the reading process includes the scheduled number N, solder information (the solder volume Snew of a new cartridge, the solder quantity Mnew of the initial solder pool Sd immediately before the printing start, the solder residual quantity Sq, the solder consumption W(S) per one printing of a substrate, etc.), paper information (the total length Pnew of the new cleaning roll 124, the residual quantity Pq of the cleaning paper 123, the cleaning paper length WPqd required for one wiping operation in the dry type cleaning, the cleaning paper length WPqw required for one wiping operation in the wet type cleaning, etc.), cleaning agent information (the cleaning agent quantity Lnew at the time when the total volume of the bottle 110 is new, the residual quantity Lq of the cleaning agent, the cleaning agent quantity WLqw consumed for the wiping operation in one wet type cleaning, etc.), the number of times N(C) of the cleaning operation of the wet type cleaning, the execution intervals (I(d), I(w)), and a reference value RN.

Subsequently, the control unit 40 initializes the number of times of print-execution Np to 0 (step S2). The number of times of print-execution is different from a production result number of times. The production result number of times is obtained by subtracting the number of defective products from a total number of times of print-execution. In this embodiment, in executing residual quantity detection, the total number of times of print-execution (including the case of defective products) is set as a parameter of control. Note that, since the management itself of the production result number of times is publicly known, in the following explanation, the explanation concerning the production result number of times is omitted.

Subsequently, the control unit executes a pre-production consumable item residual quantity check subroutine S3. According to the pre-production consumable item residual quantity check subroutine S3, the printable numbers of print substrates Q(P), Q(L), and Q(S) are calculated and, if necessary, the printable times T(P), T(L), and T(S) are calculated for each of the cleaning paper 123, the cleaning agent, and the solder. Further, in this embodiment, in the pre-production consumable item residual quantity check subroutine S3, it is determined whether residual quantities of the consumable supplies necessary per one lot are sufficient.

Thereafter, the print substrate W is carried in from the carrying-in conveyor 31 and clamped on the substrate table 20 in a printable state (step S4). Thereafter, the control unit 40 controls the operation of the substrate camera 81 and executes recognition processing for the fiducial mark provided on the print substrate W (step S5). In this process, the control unit 40 executes necessary coordinate setting, correction processing, and the like.

Subsequently, the control unit 40 executes a printing operation subroutine S6. In the printing operation subroutine S6, as in the publicly-known configuration, the control unit 40 drives the squeegee 702 in the Y-axis direction, executes printing processing, and monitors residual quantities of the consumable supplies of the sections. At this timing, quality determination for the print substrate W after printing is executed and necessary treatment is applied to the print substrate W.

Subsequently, the control unit 40 releases the clamp of the print substrate W after printing and carries out the print substrate W from the carrying-out conveyor 32 (step S7). Thereafter, the control unit 40 increments the number of times of print-execution Np (step S8) and executes a cleaning operation subroutine S9.

Subsequently, the control unit 40 determines whether the number of produced non-defective products reaches the scheduled number N (step S10). When the number of produced non-defective products does not reach the scheduled number N, the control unit 40 shifts to step S3 and repeats the processing explained above. When the control unit 40 determines in the determination in step S10 that the number of produced non-defective products reaches the scheduled number N, the control unit 40 ends the processing.

Next, the pre-production consumable item residual quantity check subroutine S3 is explained with reference to FIG. 9.

In this flow, first, the control unit 40 reads the scheduled number N (step S301) and sets a consumable item identification variable Sb to 1 (step S302). The consumable item identification variable Sb specifies a type of a consumable item for each of different values. The consumable item identification variable Sb represents each of a value indicating the solder in the not-shown solder storage container (Sb=1), a value indicating the cleaning paper 123 (Sb=2), and a value indicating the cleaning agent (Sb=3).

Subsequently, the control unit 40 obtains a residual quantity related to a consumable item related to the consumable item identification variable Sb based on the calculation explained above (or a control parameter of an ejection motor 632) (step S303).

Subsequently, the control unit 40 calculates, based on the obtained residual quantity (in this flow, the residual quantity Sq), a print executable number Q (Sb) and a printable time T(Sb) at the residual quantity (step S304). At this point, when the consumable item is the cleaning paper 123 (Sb=2) or when the consumable item is the cleaning agent (Sb=3), the control unit 40 determines, based on the reference value RN of the data storing section 48 read in step S1, to which of the periods a1 to a6 shown in FIG. 6 production start timing of this time corresponds. The control unit 40 properly uses Expression (4) to Expression (16) or Expression (20) to Expression (24) as explained above.

Subsequently, the control unit 40 displays a result of the calculation on the display of the display/operation unit 46 (step S305). Based on the displayed information, the user can continue the processing or input an interrupt command for stopping the processing.

Further, the control unit 40 compares the calculated print executable number Q(Sb) and the read scheduled number N (step S306). This processing is processing for determining whether a residual quantity of the consumable item necessary per one lot is sufficient.

In step S306, if the print executable number Q(Sb) is equal to or larger than the scheduled number N, the control unit 40 increments the consumable item identification variable Sb (step S307). The control unit 40 determines, using a value of the variable Sb, whether the residual quantity check is finished for all the relevant consumable supplies (step S308). When a consumable item is left (in the case of NO in step S308), the control unit 40 shifts to step S303 and executes the calculation and the determination concerning the next consumable item. When the determination of all the consumable supplies is finished in step S308 (in the case of YES in step S308), the control unit 40 returns to the main routine.

When the print executable number Q(Sb) is smaller than the scheduled number N in the determination in step S306, the control unit 40 shifts to step S310 and executes residual quantity shortage display processing for the consumable item related to the consumable item identification variable Sb. In the residual quantity shortage display processing, the control unit 40 executes a process of displaying a message indicating that the consumable item runs short (e.g., "The solder is likely to run short before production completion. Please supply beforehand.") on the display of the display/operation unit 46 together with a popup window and suspending the processing until button operation set on the popup window ends. The popup window is set such that, for example, an operation button for indicating that the processing may be executed, an operation button indicating that the processing is suspended, and the like are displayed and the subsequent processing is switched according to selection by the user. Consequently, the user can supply a necessary consumable item beforehand prior to operation rather than stopping the screen printing apparatus 1 during operation in order to supply the consumable item.

Figure 10:
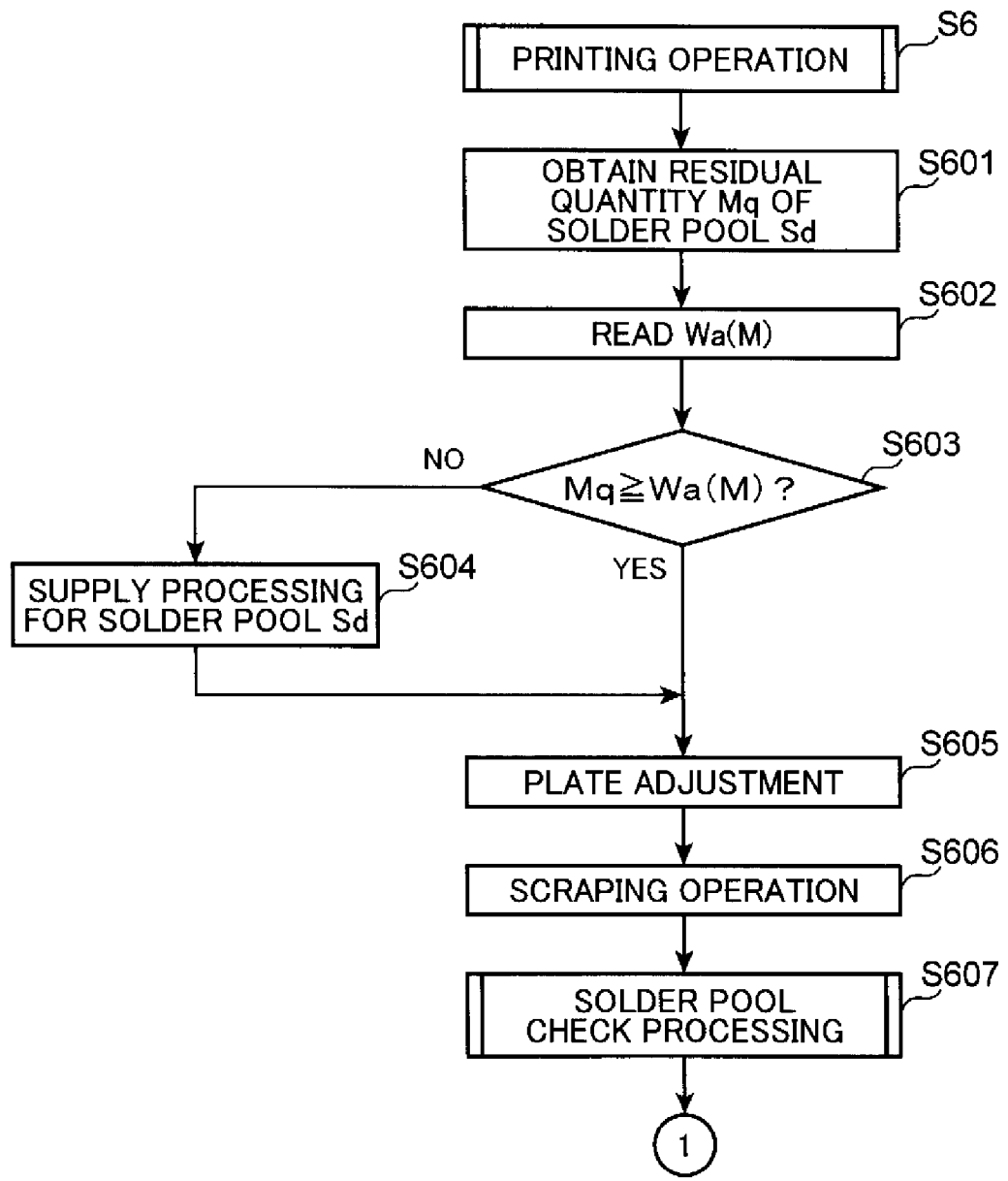
FIG. 10 is a flowchart for explaining a printing operation subroutine in the main routine shown in FIG. 8.

Referring to FIG. 10, in the printing operation subroutine S6, the control unit 40 obtains a residual quantity Mq of the solder pool Sd (step S601).

Subsequently, the control unit 40 reads a warning residual quantity Wa(M) related to the residual quantity Mq of the solder pool Sd (step S602) and compares the obtained residual quantity Sq and the warning residual quantity Wa(M) (step S603). This processing is processing for determining whether a residual quantity of the solder necessary for one printing operation is sufficient.

When the residual quantity Mq of the solder pool Sd is smaller than the warning residual quantity Wa(M) in the determination in step S603 (NO in step S603), the control unit 40 shifts to step S604 and supplies the solder to the solder pool Sd held up in a not-shown non-opening section on the front side or the rear side using the solder supply unit 60.

When the residual quantity Mq of the solder pool Sd is equal to or larger than the warning residual quantity Wa(M) in step S603, the control unit 40 continues the printing operation. At this stage, as it is well known, the control unit 40 executes plate adjustment (X-axis direction position adjustment for the substrate W by X-axis direction position adjustment for the X table 141, Y-axis direction position adjustment for the substrate W by the driving motor 15a for the substrate table 20, and Z-axis direction position adjustment on the print substrate W side by the lifting and lowering device 140) (step S605). Thereafter, the control unit 40 drives the printing executing section 70 and executes a scraping operation (step S606) for pressing the solder pool Sd on the mask sheet 51 with the squeegee 702 and applying, via a printing pattern of the mask sheet 51, the solder to the print substrate W mounted on the rear surface of the mask sheet 51. In the scraping operation, the forward printing process or the backward printing process is executed.

Figure 11:
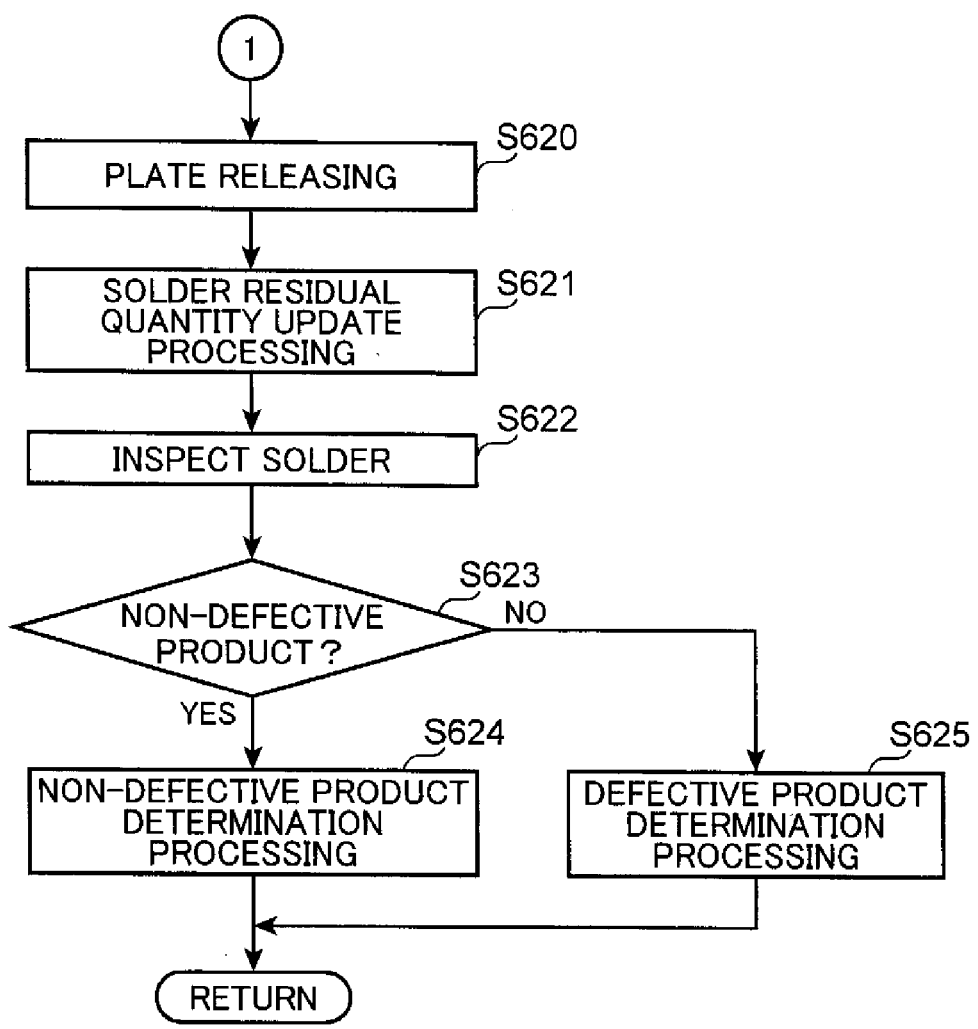
FIG. 11 is a flowchart showing a continuation of FIG. 10.

Subsequently, the control unit 40 executes solder pool check processing (step S607) and, as shown in FIG. 11, executes plate releasing (step S620) and solder residual quantity update processing (step S621). In the solder residual quantity update processing (step S621), the residual quantity Mq of the solder pool Sd is updated and, where the solder is supplied to the solder pool Sd from the solder supply unit 60, the residual quantity Sq in the solder storage container 601 is also updated. Further, as a solder inspection process, the control unit 40 picks up an image of a printing surface of the print substrate W after printing with the substrate camera 81 (step S622) and determines the quality of the print substrate W (step S623). When the print substrate W is a non-defective product, the control unit 40 executes quality determination processing (step S624) for updating both of the number of times of print-execution and a production result number. When the print substrate W is a defective product, the control unit 40 executes defective product determination processing (step S625) for updating only the number of times of print-execution and then returns to the main routine.

Referring to FIG. 4, the control unit 40 performs the solder pool check processing (step S607) by, after the forward printing process or the backward printing process ends, in a state in which the squeegee assembly 738 is pivoted clockwise or counterclockwise and flipped up, moving the printing head 704 in the backward direction or the forward direction to measure the height of the solder pool Sd in each of positions along the Y-axis direction and calculates the residual quantity Mq of the solder pool Sd while causing the sensor SC to pass above the solder pool Sd.

In the "solder pool check processing" (step S607), after the process for calculating the residual quantity Mq of the solder pool Sd is completed, the arithmetic processing section 41 determines necessity of supply of the solder at this timing as well. If the arithmetic processing section 41 determines that the residual quantity Mq of the solder pool Sd is equal to or smaller than the warning residual quantity Wa(M), the arithmetic processing section 41 supplies, using the solder supply unit 60, the solder to the solder pool Sd held up in the not-shown non-opening section on the front side or the rear side.

Conversely, when the solder remains in the solder pool Sd sufficiently, the arithmetic processing section 41 pivots the squeegee assembly 738 and lowers the squeegee assembly 738 in the Z-axis direction, presses the squeegee 702 against the print substrate W via the mask sheet 51, and moves the print substrate W in the Y-axis direction to execute printing without executing the solder supply processing.

Figure 12:
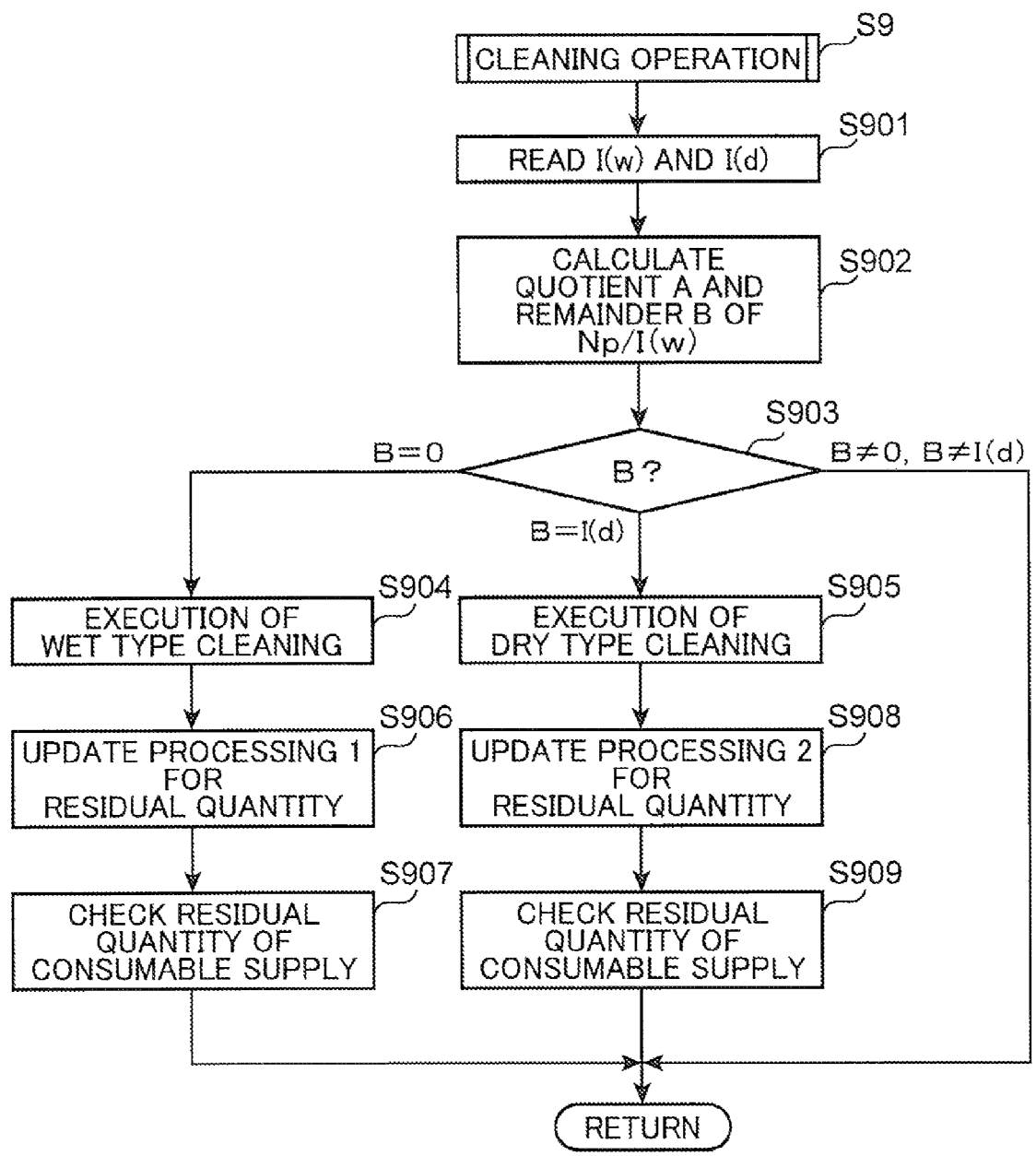
FIG. 12 is a flowchart for explaining a cleaning operation subroutine in the main routine shown in FIG. 8.

Next, the cleaning operation subroutine S9 is explained with reference to FIG. 12.

In the cleaning operation subroutine S9, at a timing when a certain printing operation ends, first, the control unit 40 reads the respective execution intervals I(w) and I(d) of the wet type cleaning and the dry type cleaning (step S901). Subsequently, the control unit 40 divides the number of times of print-execution Np by I(w) and calculates the quotient A (0, 1, 2, . . . ) and the remainder B (step S902). Subsequently, the control unit 40 executes branch determination based on the remainder B (step S903). If B=0 is satisfied in step S903, the control unit 40 proceeds to step S904 and executes the wet type cleaning. If B=I(d) is satisfied, the control unit 40 proceeds to step S905 and executes the dry type cleaning. Further, if B is neither 0 nor I(d), the control unit 40 returns to the main routine. After the wet type cleaning (step S904), the control unit 40 performs update processing 1 (step S906) for the residual quantity of the cleaning paper 123. That is, the control unit 40 sets, as a new residual quantity Pq of the cleaning paper 123, a value obtained by subtracting 2WPqw from the residual quantity Pq of the cleaning paper 123 before the wet type cleaning. The control unit 40 sets, as a new residual quantity Lq of the cleaning agent, a value obtained by subtracting 2WLqw from the residual quantity Lq of the cleaning agent before the wet type cleaning. On the other hand, after the dry type cleaning (step S905), the control unit 40 also performs update processing 2 (step S908) for the residual quantity of the cleaning paper 123. That is, the control unit 40 sets in step S906, as a new residual quantity (length) Pq of the cleaning paper 123, a value obtained by subtracting 2WPqd from the residual quantity Pq of the cleaning paper 123 before the dry type cleaning. On the other hand, the control unit 40 does not perform update processing concerning the residual quantity Lq of the cleaning agent.

Note that, after each of the update processing 1 and the update processing 2 (steps S906 and S908) for the residual quantity of the cleaning paper 123, the control unit 40 performs consumable item residual quantity check processing (steps S907 and S909). In the consumable item residual quantity check processing (step S907) after the wet type cleaning (step S904), the residual quantities Pq and Lq of the cleaning paper 123 and the cleaning agent are respectively checked. However, in the consumable item residual quantity check processing (step S909) after the dry type cleaning (step S905), residual quantity check for the cleaning agent is omitted.

In the cleaning operation explained above, the control unit 40 performs the cleaning operation by inserting the distal end of the coupling rod 127 into the engagement hole 130 and moving the substrate table 20 and the cleaning unit 90, which are integrally coupled, using the moving mechanism 15.

In the wet type cleaning, the control unit 40 sprays the cleaning agent on the rear surface of the cleaning paper 123 from the spray nozzle 122 and impregnates the cleaning agent in the cleaning paper 123. In a state in which the cleaning paper 123 is set in contact with the rear surface of the mask sheet 51, the control unit 40 moves the cleaning unit 90 in the Y-axis direction along the rear surface of the mask sheet 51 while causing a suction force to act on the rear surface side of the mask sheet 51 via the cleaning paper 123 by sucking the air in the cleaning head 120 with a suction device. At the same time, the control unit 40 sequentially sucks and wipes off, with the cleaning paper 123, cream solder protruding to the rear side of the mask sheet 51 from the opening section (a printing pattern hole) formed in the mask sheet 51 and adhering to the rear side surface while winding, with the winding roller 125, the cleaning paper 123 tensed on the upper surface of the cleaning head 120.

In the dry type cleaning, the control unit 40 does not execute to spray the cleaning agent on the rear surface of the cleaning paper 123 from the spray nozzle 122. Similar to a manner in the wet dry cleaning, the control unit 40 causes a suction force to act on the rear surface side of the mask sheet 51 and moves the cleaning unit 90 in the Y-axis direction along the rear surface of the mask sheet 51 while winding, with the winding roller 125, the cleaning paper 123 tensed on the upper surface of the cleaning head 120. However, winding speed is set appropriate and different in each of the dry type and the wet type. As a result, a quantity of use of the cleaning paper 123 by one wiping operation is different.

Next, details of the consumable item residual quantity check processing (steps S907 and S909) are respectively explained.

In the consumable item residual quantity check processing (step S907) after the wet type cleaning (step S904), the control unit 40 executes a process of comparing, concerning both of the residual quantity Pq of the cleaning paper 123 and the residual quantity Lq of the cleaning agent, warning residual quantities Wa(Pw) and Wa(L), when the residual quantity Pq or Lq is smaller than the warning residual quantity Wa(Pw) or the warning residual quantity Wa(L), displaying a message indicating that the consumable item runs short (e.g., "The cleaning paper is likely to run short before the end of the printing work. Please supply beforehand.") on the display of the display/operation unit 46 together with a popup window, and suspending the processing until button operation set in the popup window ends.

In the consumable item residual quantity check processing (step S909) after the dry type cleaning (step S905), the control unit 40 compares the residual quantity Pq of the cleaning paper 123 and the warning residual quantity Wa(Pd) and, where the residual quantity Pq runs short, carries out warning and suspension of the processing same as those explained above.

As explained above, the screen printing apparatus 1 according to this embodiment is the apparatus that sequentially carries out printing on the plurality of print substrates W. The screen printing apparatus 1 includes the mask sheet 51 on which the printing pattern is formed, the squeegee 702 is configured to come into slide contact with the front surface of the mask sheet 51 to print the applying material, which is supplied to the front surface of the mask sheet 51, on the print substrate W mounted on the rear surface of the mask sheet 51, the cleaning unit 90 is configured to let out, based on the number of printings (the number of times of print-execution Np), at a frequency set in advance, the cleaning paper 123 functioning as a cleaning sheet, and cleaning the rear surface of the mask sheet 51, and the cleaning agent supply unit 100 is configured to supply the cleaning agent to the cleaning paper 123 at every predetermined execution interval of the wet type cleaning. The screen printing apparatus 1 includes the control unit 40 as the residual quantity obtaining section configured to obtain, before the execution of the printing on a new print substrate W, a residual quantity of a consumable item consumed during cleaning or printing.

The control unit 40 in this embodiment configures the processable quantity predicting section configured to predict the printable numbers of print substrates Q(P), Q(L), and Q(S) before the start of printing based on the obtained residual quantity and causes the display/operation unit 46 to function as the prediction-result informing section configured to inform a prediction-result by the processable quantity predicting section.

That is, in this embodiment, prior to lot production or prior to time when suspended lot production is resumed, a residual quantity of a consumed consumable item is obtained in advance before the printing executing section 70 operates. The printable number of print substrates Q(P), Q(L), and Q(S) are predicted based on the residual quantity and a prediction-result is displayed. Therefore, the user can determine, according to the predicted number of printings, whether a user should cause the screen printing apparatus 1 to operate as it is or whether the user should supply a necessary consumable item beforehand.

In the screen printing apparatus 1 according to this embodiment, the cleaning unit 90 executes, based on the execution interval of the wet type cleaning, the wet type cleaning for cleaning the rear surface of the mask sheet 51 using the cleaning paper 123 to which the cleaning agent is supplied. When the cycle from certain wet type cleaning to the next wet type cleaning is set as one cleaning cycle, the cleaning unit 90 executes, based on the execution interval of the dry type cleaning set in advance in the one cleaning cycle, the dry type cleaning for cleaning the mask sheet 51 using the cleaning paper 123 to which the cleaning agent is not supplied. The control unit 40 executes the processing for calculating the number of times uN(P) of the wet type cleaning is executable with the residual quantity Pq as the number of cleaning cycles based on the residual quantity Pq of the cleaning paper 123 obtained by the control unit 40, the consumption WPqd of the cleaning paper 123 consumed in one wiping operation in the dry type cleaning, and the consumption WPqw of the cleaning paper 123 consumed in one wiping operation in the wet type cleaning and the processing for calculating the print executable number Q(P) based on the calculated number of times of wet type cleaning execution.

Further, in the screen printing apparatus 1 according to this embodiment, the control unit 40 predicts the print executable number Q(L) based on the execution interval of the wet type cleaning, a quantity of the cleaning agent supplied to the cleaning paper 123 at every execution interval of the wet type cleaning, and a residual quantity of the cleaning agent obtained by the control unit 40 functioning as the residual quantity obtaining section.

That is, the control unit 40 executes the processing for calculating the printable number of print substrates Q(P) and Q(L) with the residual quantity Pq of the cleaning paper 123 obtained by the control unit 40. In this embodiment, if the number of times uN(P) of the wet type cleaning and the residual quantity Pq of the cleaning paper 123 are known, it is possible to predict the residual quantity Pq of the cleaning paper 123 after the wet type cleaning is carried out a predetermined number of times.

In the screen printing apparatus 1 according to this embodiment, the control unit 40 predicts the print executable number Q(L) based on the execution interval I(w) of the wet type cleaning, the quantity Lq of the cleaning agent supplied at every execution interval I(w) of the wet type cleaning, and the residual quantity of the cleaning agent obtained by the control unit 40 functioning as the residual quantity obtaining section.

In the screen printing apparatus 1 according to this embodiment, the control unit 40 includes the function of counting the number of times of use of the cleaning agent and obtaining the residual quantity Lq of the cleaning agent. The control unit 40 predicts the print executable number Q(L) with the residual quantity Lq of the cleaning agent obtained by the control unit 40 based on the execution interval I(w) of the wet type cleaning and the quantity WLqw of the cleaning agent supplied to the cleaning paper 123 at every execution interval I(w) of the wet type cleaning.

In the screen printing apparatus 1 according to this embodiment, the solder supply unit 60 includes the solder storage container 601 for storing the solder. The control unit 40 obtains the residual quantity Sq of the solder in the solder storage container 601 and calculates the print executable number Q(S). That is, if a quantity of the solder used for set-up and not used for actual printing is subtracted from the residual quantity Sq in the new solder storage container 601 in which the solder is filled, the residual quantity Sq of the solder in the solder storage container 601, which can be used for printing, is known. Consequently, it is possible to further calculate the print executable number Q(S), which indicates how many print substrates can be further printed, execute maintenance of the solder storage container 601 in advance, and improve an operating ratio of the screen printing apparatus 1. Note that, when the solder storage container 601 is changed to a new one during printing of the plurality of print substrates W, set-up is sometimes unnecessary. It is also unnecessary to subtract a quantity of the solder adhering to the squeegee 702. Therefore, the residual quantity Sq of the solder, which can be used for printing, in the solder storage container 601 is Snewθ.

In the screen printing apparatus 1 according to this embodiment, it is determined whether the calculated printable numbers of print substrates Q(P), Q(L), and Q(S) reach the number of the print substrates W produced per one lot (the scheduled number N) and a notification of a result of the determination is issued. Therefore, the user can determine, according to the determination result, whether the user should cause the screen printing apparatus 1 to operate as it is or whether the user should supply a necessary consumable item beforehand.

In the screen printing apparatus 1 according to this embodiment, the cleaning agent supply unit 100 includes the bottle 110 that enables it to be refilled with the cleaning agent. The control unit 40 calculates the print executable number Q(L) based on the residual quantity Lq of the cleaning agent. When the calculated print executable number Q(L) with the residual quantity Lq of the cleaning agent is smaller than the scheduled number N of the print substrates W produced per one lot, the control unit 40 executes the processing for calculating a shortage cleaning agent refill quantity S(L). Therefore, in this embodiment, when the cleaning agent supply unit 100 including the bottle 110 that is refilled with the cleaning agent is adopted, if the scheduled number N per one lot is in shortage, the shortage cleaning agent refill quantity S(L) is calculated and a calculation result can be displayed by the display/operation unit 46. Therefore, the user not only can learn beforehand the necessity of refilling of a necessary consumable item before production of the print substrate W is started but also can grasp the cleaning agent refill quantity S(L) necessary for refill. Therefore, it is possible to continuously machine the print substrates W for one lot without stopping the screen printing apparatus during production and easily prepare an appropriate quantity of the cleaning agent.

The control unit 40 according to this embodiment configures (includes) the print-execution count section configured to count the number of times of print-execution Np after the start of execution of printing on a plurality of new print substrates and the updating section configured to update the residual quantities Pq, Lq, and Sq based on the number of times of print-execution Np counted by the print-execution count section. At the same time, the control unit 40 also functions as a warning determining section configured to determine whether the printable number of print substrates Q(P), Q(L), and Q(S) predicted by the control unit 40 after the update of the residual quantities are smaller than warning residual quantities set in advance. The display/operation unit 46 in this embodiment also functions as a warning informing section configured to provide a warning when, during the operation of the printing executing section 70, the printable number of print substrates Q(P), Q(L), and Q(S) predicted by the control unit 40 is smaller than the warning residual quantities Wa(P), Wa(L), and Wa(S) set in advance. Therefore, in this embodiment, residual quantities of consumable supplies obtained by the control unit 40 are updated according to the number of times of print-execution Np. Therefore, according to the update, the prediction values (the printable number of print substrates Q(P), Q(L), and Q(S)) are also updated. When the updated prediction values are smaller than the warning residual quantities set in advance, a warning is issued. Therefore, the user can learn that the residual quantities of the consumable supplies run short making use of the displayed prediction values and appropriately perform, for example, preparation for supply of the consumable supplies.

In the screen printing apparatus 1 of such a form, the control unit 40 includes the solder sensor SC configured to obtain the residual quantity Mq of the solder pool Sd on the mask sheet 51 before the operation of the printing executing section 70. The processable quantity predicting section predicts the print executable number Q(M) based on the residual quantity Mq of the solder pool Sd obtained by the solder sensor SC. Therefore, in this embodiment, before the printing executing section 70 operates, a residual quantity of the solder pool Sd consumed as a consumable item required for the printing operation is obtained. The print executable number Q(M) is predicted based on the residual quantity of the solder pool Sd and a prediction-result is displayed. Therefore, in this form, as in the form explained above, the user can determine, according to the predicted number of printings, whether the user should cause the screen printing apparatus 1 to operate as it is or whether the user should supply a necessary consumable item beforehand.

Note that the present disclosure is not limited to the embodiment explained above. Various changes can be performed other than the changes explained above without departing from the spirit of the present disclosure.

For example, the screen printing apparatus 1 according to the embodiment may be used in a production line (a dual line, etc.) for causing a plurality of the screen printing apparatuses 1 to operate in parallel.

A maintenance form for only refilling the same bottle with the cleaning agent rather than replacing both of the cleaning agent and the bottle 110 is also conceivable. In such a form, the data storing section 48 has stored therein the scheduled number N, the execution interval I(w) of the wet type cleaning, the number of times of the cleaning operation of the wet type cleaning (the cleaning count number of times) N(C), the consumption WLq of the cleaning agent used for every execution of the wet type cleaning (the consumption WLq of the cleaning agent necessary for one wiping operation is determined by the specifications of the spray nozzle 122), and Lq serving as a residual quantity of the cleaning agent updated at every execution interval I(w) of the wet type cleaning. The subsequent print executable number Q(L) is calculated from the residual quantity Lq of the cleaning agent according to step S304 in FIG. 9. Therefore, the number of printings for which printing is to be executed after refill of the cleaning agent (the number of printings for which printing can be executed based on a refill quantity of the cleaning agent) Q'(L) is calculated as follows:

$$Q'(L)=N-N(C)\times I(w)-Q(L) \quad (25).$$

The residual quantity Lq of the cleaning agent is updated when the wet type cleaning is finished. Therefore, after the update, first I(w) print substrates W can be printed even if the cleaning agent is not supplied. When a quotient E and a remainder F of Q'(L)/I(w) are calculated, if F is 0, the number of times N'(C) of the wet type cleaning, which should be carried out during sequential printing on Q'(L) print substrates W, is calculated as follows:

$$N'(C)=(E-1) \quad (26).$$

If F is not 0, the number of times N'(C) is calculated as follows:

$$N'(C)=E \quad (27).$$

A quantity of the cleaning agent consumed when the wet type cleaning is carried out N'(C) times is N'(C)×WLq. The quantity is the refill quantity S(L) of the cleaning agent. Therefore, the refill quantity S(L) is calculated as follows:

$$S(L) = (E-1) \times WLq, \text{ where the remainder } F = 0$$
$$= E \times WLq, \text{ where the remainder } F \neq 0.$$

Figure 9:
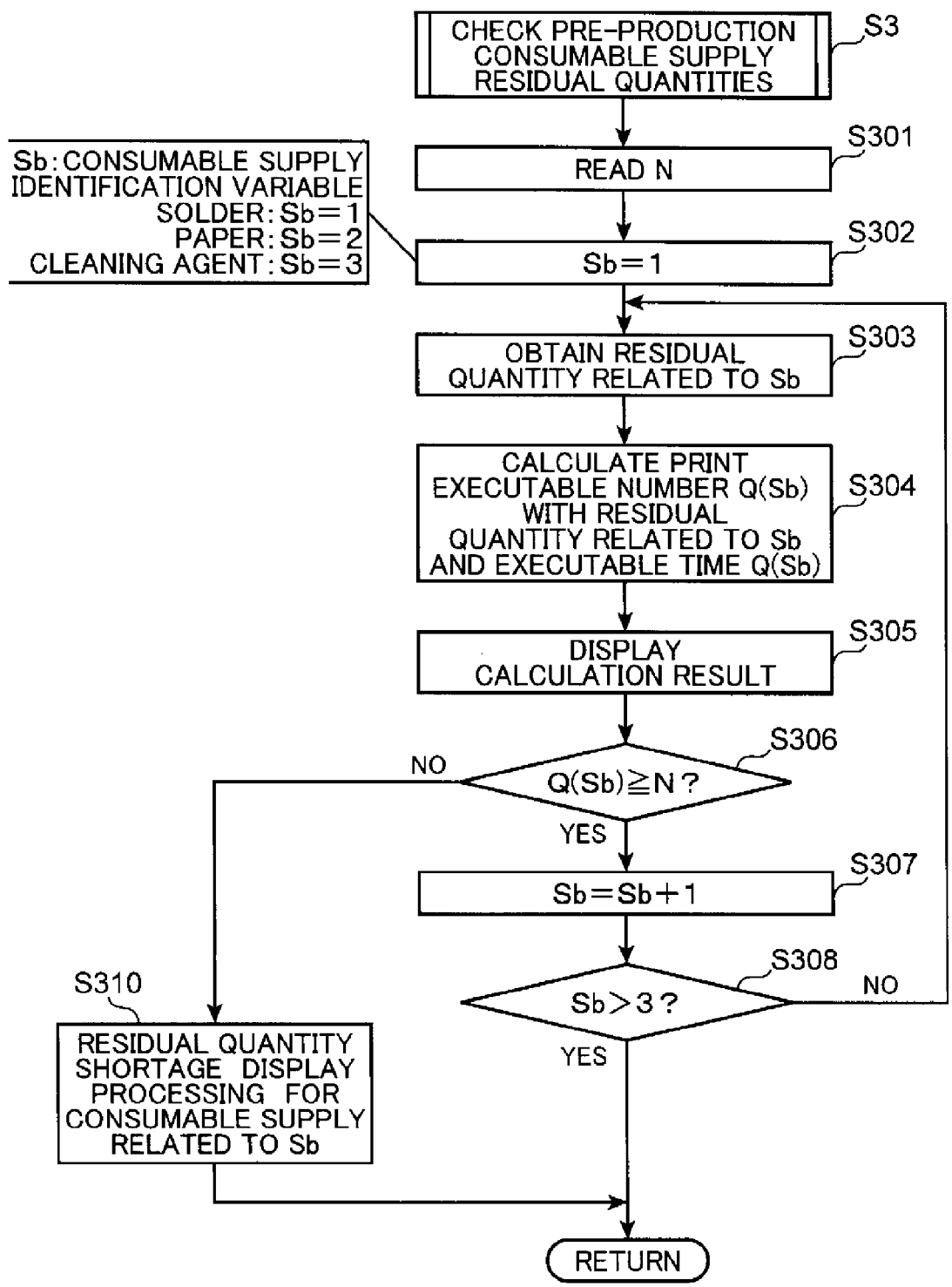
FIG. 9 is a flowchart for explaining a pre-production consumable item residual quantity check subroutine in the main routine shown in FIG. 8.

Consequently, simultaneously with the shortage display processing explained in FIG. 9, it is possible to also display the refill quantity S(L) of the cleaning agent that should be added. Therefore, the user not only can learn beforehand the necessity of refilling a necessary cleaning agent before production of the print substrate W is started but also can provide beforehand the cleaning agent refill quantity S(L) necessary for refill. Therefore, it is possible to continuously machine the print substrates W for one lot without stopping the screen printing apparatus 1 during production and easily prepare an appropriate quantity of the cleaning agent.

In this embodiment, the "solder quantity measurement" is performed every time the forward printing processing and the backward printing process are switched and the "solder supply" is performed as appropriate based on a result obtained by the "solder quantity measurement". However, execution timings of the "solder quantity measurement" and the "solder supply" are not limited to this.

The "solder quantity measurement" process and the "solder supply" process may be executed every time printing is executed on a predetermined number of the print substrates W. Consequently, it is possible to save time related to the "solder quantity measurement" process and the "solder supply" process and improve printing efficiency.

In the embodiment, a solder quantity of the solder pool Sd is measured by one solder sensor SC attached to the lower surface of the motor for squeegee pivoting 736. However, a type, the number, disposing positions, and the like of sensors are not limited to this. For example, solder sensors may be respectively attached to the rear side and the front side in the Y-axis direction of the printing head 704. Output signals from the sensors may be properly used according to timing of solder quantity measurement.

In the embodiment, the sensor of the type for detecting a height from the sensor to a detection place is used as the solder sensor. The cross section of the solder pool Sd on the YZ plane can be measured. A solder residual quantity of the solder pool Sd is calculated based on the sectional shape of the solder pool Sd in the Y-axis direction and the X-axis direction length Xs. However, a method of calculating a solder residual quantity is not limited to this. For example, the solder sensor may estimate the cross section of the solder pool Sd on the YZ plane from viscosity data of the solder simply using only width Ds in the Y-axis direction of the solder pool Sd. A solder residual quantity may be calculated based on a cross sectional area or the like of the solder pool Sd.

In the embodiment, as shown in FIG. 6, the "wet type cleaning" is executed at an interval of four printings from the first printing operation and the "dry type cleaning" is executed at an interval of two printings from a timing when the wet type cleaning is executed. However, when it is anticipated that the mask seat 51 is seriously soiled, for example, the "wet type cleaning" is executed at an interval of three print substrates from the first printing operation and the "dry type cleaning" may be executed at an interval of two printings from a timing when the wet type cleaning is executed.

The cleaning sheet is not limited to paper and may be a cotton product such as gauze.

Besides, it goes without saying that various changes are possible within the scope of the claims of the present disclosure.

Therefore, the present disclosure provides a screen printing apparatus sequentially carrying out printing on a plurality of print substrates, the screen printing apparatus including: a mask sheet on which a printing pattern is formed; a squeegee configured to come into slide contact with the front surface of the mask sheet to print, on the print substrate mounted on the rear surface of the mask sheet, an applying material supplied to the front surface of the mask sheet; a cleaning unit configured to clean the rear surface of the mask sheet by feeding out a cleaning sheet at every predetermined execution interval of cleaning; a cleaning agent supply unit configured to supply a cleaning agent to the cleaning sheet at every predetermined execution interval of the cleaning; a residual quantity obtaining section configured to obtain a residual quantity of a consumable item consumed during cleaning or printing; a processable quantity predicting section configured to predict a print executable number based on the residual quantity obtained by the residual quantity obtaining section, the printable number being a scheduled number for producing the substrate; and prediction-result informing section configured to inform a prediction-result by the processable quantity predicting section. In this mode, prior to a time when lot production for sequentially printing a plurality of print substrates, or prior to a time when suspended lot production is resumed, residual quantities of consumable supplies consumed by the cleaning unit and the cleaning agent supply unit are obtained in advance. The print executable number is predicted based on the residual quantities and a prediction-result is displayed. Therefore, a user can determine, according to the predicted number of printings, whether the user should start the screen printing apparatus to operate as it is or whether the user should supply necessary consumable supplies beforehand.

In the screen printing apparatus of a preferred form, the cleaning unit executes wet type cleaning for cleaning the mask sheet using the cleaning sheet at a timing when the cleaning agent is supplied to the cleaning sheet by the cleaning agent supply unit, and the cleaning unit executes dry type cleaning for cleaning the mask sheet using the cleaning sheet without supply of the cleaning agent. The processable quantity predicting section calculates a number of times of wet type cleaning execution, as a number of cleaning cycles, that is executable with the residual quantity of the cleaning sheet, based on the residual quantity of the cleaning sheet obtained by the residual quantity obtaining section, a consumption of the cleaning sheet consumed in one wiping operation in the dry type cleaning, and a consumption of the cleaning sheet consumed in one wiping operation in the wet type cleaning, and the processable quantity predicting section executes calculations of the print executable number based on the calculated number of times of wet type cleaning execution. In this form, if the residual quantity of the cleaning sheets is known, it is possible to learn on how many print substrates printings can be performed.

In the screen printing apparatus of a more preferred form, the processable quantity predicting section predicts a print executable number based on a quantity of the cleaning agent supplied to the cleaning sheet at every predetermined execution interval of the wet type cleaning and an execution interval of the wet type cleaning with the supply of the cleaning agent. In this form, if the residual quantity of the cleaning agent is known, it is possible to learn on how many print substrates printing can be performed.

In the screen printing apparatus of a preferred form, the screen printing apparatus includes a container storing the applying material. The residual quantity obtaining section obtains a residual quantity of the applying material in the container. In this form, in a form in which the container storing the applying material is held, it is possible to obtain a residual quantity of the applying material in the container in advance before a start of printing, predict a print executable number based on the obtained applying material, and notify the user of the print executable number. Therefore, the user can execute maintenance of the applying material beforehand according to the print executable number notified to the user. Consequently, it is possible to improve an operating ratio of the screen printing apparatus.

In the screen printing apparatus of a preferred form, the processable quantity predicting section executes a process of determining whether the print executable number reaches a scheduled number in one lot. The prediction-result informing section displays a result of the determination concerning whether the print executable number reaches the scheduled number. In this form, before the production of the print substrate is started, it is predicted whether the print executable number based on a present residual quantity of the consumable item reaches the scheduled number per one lot and a prediction-result is displayed. Therefore, since the user can learn necessity of supply of a necessary consumable item beforehand before the production of the print substrate is started, by determining according to the predicted number of printings whether the user should cause the screen printing apparatus as it is or whether the user should supply the necessary consumable item beforehand, the user can continuously machine the print substrates for one lot without stopping the screen printing apparatus during production.

In the screen printing apparatus of such a form, the cleaning agent supply unit includes a bottle that enables refilling with the cleaning agent. The processable quantity predicting section executes a process of calculating the print executable number based on the residual quantity of the cleaning agent obtained by the residual quantity obtaining section, and the processable quantity predicting section executes a process of calculating a shortage of a cleaning agent refill quantity, where the calculated print executable number is smaller than the scheduled number in one lot. In this form, since the cleaning agent supply unit including the bottle that is refilled with the cleaning agent is adopted, when the scheduled number per one lot is in shortage, the shortage cleaning agent refill quantity can be calculated and a calculation result can be displayed. Therefore, the user not only can learn beforehand the necessity of refilling a necessary consumable item before the production of the print substrate is started but also can obtain beforehand the cleaning agent refill quantity necessary for refill. Therefore, it is possible to continuously machine the print substrates for one lot without stopping the screen printing apparatus during production and easily prepare an appropriate quantity of the cleaning agent.

In the screen printing apparatus of a preferred form, the residual quantity obtaining section includes: a print-execution count section configured to count the number of times of print-execution after a start of execution of printing on a plurality of new print substrates; and an updating section configured to update the residual quantity based on the number of times of print-execution counted by the print-execution count section. The screen printing apparatus further includes: a warning determining section configured to determine whether the print executable number predicted by the processable quantity predicting section after the update of the residual quantity is smaller than a predetermined warning residual quantity; and a warning informing section configured to provide a warning when, during subsequent printing on the plurality of print substrates, the print executable number predicted by a processable quantity predicting section is smaller than the predetermined warning residual quantity. In this form, since the residual quantity of the consumable item obtained by the residual quantity obtaining section is updated according to the number of times of print-execution, according to the update, a prediction value of the processable quantity predicting section is also updated. When the updated print executable number is smaller than the predetermined warning residual quantity, the warning is issued. Therefore, the user can learn that the residual quantity of the consumable item will run short making use of the prediction value of the processable quantity predicting section and appropriately perform, for example, preparation of supply of the consumable item.

In the screen printing apparatus of a preferred form, the residual quantity obtaining section includes a sensor configured to detect a residual quantity of the applying material on the mask sheet prior to starting printing on a plurality of new print substrates. The processable quantity predicting section is configured to predict the print executable number based on the residual quantity of the applying material detected by the sensor. In this form, before the start of the printing, a residual quantity of the applying material consumed as a consumable item required for a printing operation is detected by the sensor. The print executable number is predicted based on the residual quantity of the applying material and a prediction-result is displayed. Therefore, in this form, as in the form explained above, the user can determine, according to the predicted number of printings, whether the user should cause the screen printing apparatus to operate as it is or whether the user should supply necessary consumable supplies beforehand.

As explained above, according to the present disclosure, before the start of the printing on the print substrate, the user can determine whether the user should cause the screen printing apparatus to operate as it is or whether the user should supply necessary consumable supplies beforehand. Therefore, a remarkable effect is attained that it is possible to enable preferred consumption prediction of a consumable item at a required timing, thereby contributing to improvement of an operating ratio.

INDUSTRIAL APPLICABILITY

The present disclosure is suitable for a technical field for automatically printing solder paste on a print substrate.

The invention claimed is:

1. A screen printing apparatus sequentially carrying out printing on a plurality of print substrates, the screen printing apparatus comprising:
   a mask sheet on which a printing pattern is formed;
   a squeegee configured to print an applying material supplied to a front surface of the mask sheet on a print substrate put beneath a rear surface of the mask sheet, by contacting with the front surface of the mask sheet;
   a cleaning unit configured to clean the rear surface of the mask sheet by feeding out a cleaning sheet at every predetermined execution interval of cleaning;
   a cleaning agent supply unit configured to supply a cleaning agent to the cleaning sheet at every predetermined execution interval of the cleaning;
   a residual quantity obtaining section configured to obtain a residual quantity of a consumable item consumed during cleaning;
   a processable quantity predicting section configured to predict a number of executable printings based on the residual quantity obtained by the residual quantity obtaining section, the number of executable printings being a scheduled number of printings for producing the substrates; and
   a prediction-result informing section configured to provide a prediction-result by the processable quantity predicting section, wherein
   the cleaning unit executes wet type cleaning for cleaning the mask sheet using the cleaning sheet at a timing when the cleaning agent is supplied to the cleaning sheet by the cleaning agent supply unit, and the cleaning unit executes dry type cleaning for cleaning the mask sheet using the cleaning sheet without supply of the cleaning agent based on a predetermined execution interval of the dry type cleaning within one cleaning cycle, supposing that the one cleaning cycle is a cycle from a certain wet type cleaning to a next wet type cleaning, and
   the processable quantity predicting section calculates a number of times of wet type cleaning execution, as a number of cleaning cycles, that is executable with the residual quantity of the cleaning sheets, based on the residual quantity of the cleaning sheets obtained by the residual quantity obtaining section, a consumption of the cleaning sheets consumed in one wiping operation in the dry type cleaning, and a consumption of the cleaning sheets consumed in one wiping operation in the wet type cleaning, and the processable quantity predicting section executes calculations of the number of executable printings based on the calculated number of times of wet type cleaning.

2. The screen printing apparatus according to claim 1, wherein the processable quantity predicting section predicts the number of executable printings based on a residual quantity of the cleaning agent obtained by the residual quantity obtaining section, a quantity of the cleaning agent supplied to the cleaning sheets at every predetermined execution interval of the wet type cleaning, and an execution interval of the wet type cleaning with the supply of the cleaning agent, in addition to the residual quantity of the consumable item consumed during cleaning.

3. The screen printing apparatus according to claim 1, further comprising a container storing an applying material, wherein
   the residual quantity obtaining section likewise obtains a residual quantity of the applying material in the container consumed in printing, the processable quantity predicting section likewise predicts the number of executable printings based on the residual quantity of applying material and the quantity of the applying material to be consumed during printing.

4. The screen printing apparatus according to claim 3, wherein
the residual quantity obtaining section includes a sensor configured to detect the residual quantity of the applying material on the mask sheet prior to start of printing on a plurality of new print substrates, the applying material to be consumed by printing, and
section is configured to likewise predict the number of executable printings based on the residual quantity of the applying material detected by the sensor, and the applying material to be consumed by printing.

5. The screen printing apparatus according to claim 1, wherein
the processable quantity predicting section executes a process of determining whether the number of executable printings reaches a production planned number of print substrates produced in one lot, and
the prediction-result informing section displays a result of the determination concerning whether the number of executable printings reaches the production planned number of print substrates.

6. A screen printing apparatus sequentially carrying out printing on a plurality of print substrates, the screen printing apparatus comprising:
a mask sheet on which a printing pattern is formed;
a squeegee configured to print an applying material supplied to a front surface of the mask sheet on a print substrate put beneath a rear surface of the mask sheet, by contacting with the front surface of the mask sheet;
a cleaning unit configured to clean the rear surface of the mask sheet by feeding out a cleaning sheet at every predetermined execution interval of cleaning;
a cleaning agent supply unit configured to supply a cleaning agent to the cleaning sheet at every predetermined execution interval of the cleaning;
a residual quantity obtaining section configured to obtain a residual quantity of a consumable item consumed during cleaning;
a processable quantity predicting section configured to predict a number of executable printings based on the residual quantity obtained by the residual quantity obtaining section, the number being a scheduled number of printings for producing the substrates; and
a prediction-result informing section configured to provide a prediction-result by the processable quantity predicting section, wherein
the processable quantity predicting section executes a process of determining whether the number of executable printings reaches a production planned number of print substrates produced in one lot,
the prediction-result informing section displays a result of the determination concerning whether the number of executable printings reaches the production planned number of print substrates,
the cleaning agent supply unit includes a bottle that enables refilling with the cleaning agent, and
the processable quantity predicting section executes a process of calculating the number of executable printings based on a residual quantity of the cleaning agent obtained by the residual quantity obtaining section, and the processable quantity predicting section executes a process of calculating a shortage of a refill quantity of the cleaning agent, where the number of executable printings is smaller than the scheduled number in one lot.

7. The screen printing apparatus according to claim 1, wherein
the residual quantity obtaining section includes a print-execution count section configured to count a number of times of print-execution after a start of execution of printing on a plurality of new print substrates, and an updating section configured to update the residual quantity based on the number of times of print-execution counted by the print-execution count section, the residual quantity obtaining section likewise obtains a residual quantity of the consumable item consumed during cleaning, and
the screen printing apparatus further comprises:
a warning determining section configured to determine whether the number of executable printings predicted by the processable quantity predicting section after the update of the residual quantity is smaller than a predetermined warning residual quantity; and
a warning informing section configured to provide a warning during subsequent printing on the plurality of print substrates when the number of executable printings predicted by the processable quantity predicting section is smaller than the predetermined warning residual quantity.

8. The screen printing apparatus according to claim 2, further comprising a container storing an applying material, wherein
the residual quantity obtaining section likewise obtains a residual quantity of the applying material in the container consumed in printing,
the processable quantity predicting section likewise predicts the number of executable printings based on the residual quantity of the applying material and the quantity of the applying material to be consumed during printing.

9. The screen printing apparatus according to claim 2, wherein
the processable quantity predicting section executes a process of determining whether the number of executable printings reaches a production planned number of print substrates produced in one lot, and
the prediction-result informing section displays a result of the determination concerning whether the print executable number reaches the production planned number of print substrates.

10. The screen printing apparatus according to claim 3, wherein
the processable quantity predicting section executes a process of determining whether the number of executable printings reaches a production planned number of print substrates produced in one lot, and
the prediction-result informing section displays a result of the determination concerning whether the print executable number reaches the production planned number of print substrates.

11. The screen printing apparatus according to claim 4, wherein
the processable quantity predicting section executes a process of determining whether the number of executable printings reaches a production planned number of print substrates produced in one lot, and the prediction-result informing section displays a result of the determination concerning whether the number of executable printings reaches the production planned number of print substrates.

12. The screen printing apparatus according to claim 2, wherein the residual quantity obtaining section includes a print-execution count section configured to count a number of times of print-execution after a start of execution of printing on a plurality of new print substrates, and an updating section configured to update the residual quantity based on the number of times of print-execution counted by the print-execution count section, the residual quantity obtaining section likewise obtains the residual quantity of the consumable item consumed during cleaning, and the screen printing apparatus further comprises:

a warning determining section configured to determine whether the number of executable printings predicted by the processable quantity predicting section after the update of the residual quantity is smaller than a predetermined warning residual quantity; and a warning informing section configured to provide a warning during subsequent printing on the plurality of print substrates when the number of executable printings predicted by the processable quantity predicting section is smaller than the predetermined warning residual quantity.

13. The screen printing apparatus according to claim 3, wherein the residual quantity obtaining section includes a print-execution count section configured to count a number of times of print-execution after a start of execution of printing on a plurality of new print substrates, and an updating section configured to update the residual quantity based on the number of times of print-execution counted by the print-execution count section, the residual quantity obtaining section likewise obtains a residual quantity of the consumable item consumed during cleaning, and the screen printing apparatus further comprises:

a warning determining section configured to determine whether the number of executable printings predicted by the processable quantity predicting section after the update of the residual quantity is smaller than a predetermined warning residual quantity; and a warning informing section configured to provide a warning during subsequent printing on the plurality of print substrates when the number of executable printings predicted by the processable quantity predicting section is smaller than the predetermined warning residual quantity.

14. The screen printing apparatus according to claim 4, wherein the residual quantity obtaining section includes a print-execution count section configured to count a number of times of print-execution after a start of execution of printing on a plurality of new print substrates, and an updating section configured to update the residual quantity based on the number of times of print-execution counted by the print-execution count section, the residual quantity obtaining section likewise obtains a residual quantity of the consumable item consumed during cleaning, and the screen printing apparatus further comprises:

a warning determining section configured to determine whether the number of executable printings predicted by the processable quantity predicting section after the update of the residual quantity is smaller than a predetermined warning residual quantity; and a warning informing section configured to provide a warning during subsequent printing on the plurality of print substrates when the number of executable printings predicted by the processable quantity predicting section is smaller than the predetermined warning residual quantity.

15. The screen printing apparatus according to claim 5, wherein the residual quantity obtaining section includes a print-execution count section configured to count a number of times of print-execution after a start of execution of printing on a plurality of new print substrates, and an updating section configured to update the residual quantity based on the number of times of print-execution counted by the print-execution count section, the residual quantity obtaining section likewise obtains a residual quantity of the consumable item consumed during cleaning, and the screen printing apparatus further comprises:

a warning determining section configured to determine whether the number of executable printings predicted by the processable quantity predicting section after the update of the residual quantity is smaller than a predetermined warning residual quantity; and a warning informing section configured to provide a warning during subsequent printing on the plurality of print substrates when the number of executable printings predicted by the processable quantity predicting section is smaller than the predetermined warning residual quantity.

16. The screen printing apparatus according to claim 6, wherein the residual quantity obtaining section includes a print-execution count section configured to count a number of times of print-execution after a start of execution of printing on a plurality of new print substrates, and an updating section configured to update the residual quantity based on the number of times of print-execution counted by the print-execution count section, the residual quantity obtaining section likewise obtains a residual quantity of the consumable item consumed during cleaning, and the screen printing apparatus further comprises:

a warning determining section configured to determine whether the number of executable printings predicted by the processable quantity predicting section after the update of the residual quantity is smaller than a predetermined warning residual quantity; and a warning informing section configured to provide a warning during subsequent printing on the plurality of print substrates when the number of executable printings predicted by the processable quantity predicting section is smaller than the predetermined warning residual quantity.

* * * * *